(12) United States Patent
Yoshimizu et al.

(10) Patent No.: US 12,317,494 B2
(45) Date of Patent: May 27, 2025

(54) SEMICONDUCTOR STORAGE DEVICE

(71) Applicant: Kioxia Corporation, Tokyo (JP)

(72) Inventors: Yasuhito Yoshimizu, Yokkaichi Mie (JP); Hiroshi Nakaki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/393,002

(22) Filed: Dec. 21, 2023

(65) Prior Publication Data

US 2024/0164102 A1 May 16, 2024

Related U.S. Application Data

(63) Continuation of application No. 17/188,575, filed on Mar. 1, 2021, now Pat. No. 11,882,700.

(30) Foreign Application Priority Data

Sep. 1, 2020 (JP) .................................. 2020-146517

(51) Int. Cl.
*H10B 43/27* (2023.01)
*H01L 23/00* (2006.01)
*H01L 23/522* (2006.01)
*H01L 25/065* (2023.01)
(Continued)

(52) U.S. Cl.
CPC ......... *H10B 43/27* (2023.02); *H01L 23/5226* (2013.01); *H01L 24/08* (2013.01); *H01L 25/0657* (2013.01); *H01L 25/18* (2013.01); *H10B 41/27* (2023.02); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| 2017/0084624 A1 | 3/2017 | Lee et al. |
| 2020/0212059 A1 | 7/2020 | Nishikawa |
| 2020/0303408 A1 | 9/2020 | Yoshimizu et al. |

(Continued)

FOREIGN PATENT DOCUMENTS

| CN | 110249427 A | 9/2019 |
| JP | 2018-026518 A | 2/2018 |
| TW | 202025155 A | 7/2020 |

*Primary Examiner* — Sarah K Salerno
(74) *Attorney, Agent, or Firm* — Kim & Stewart LLP

(57) ABSTRACT

A semiconductor storage device includes first and second stacks, and first to fourth semiconductor layers. The first stack includes first conductive layers and first insulating layers alternately stacked in a first direction. The first semiconductor layer extends through the first stack. The second semiconductor layer extends in a second direction above the first stack and connected to the first semiconductor layer. The second stack includes second conductive layers and second insulating layers alternately stacked in the first direction. The first and second stacks are arranged in a third direction. The third semiconductor layer extends through the second stack. The fourth semiconductor layer extends in the second direction above the second stack and connected to the third semiconductor layer. A third conductive layer is in contact with upper surfaces of the second and fourth semiconductor layers. The second and fourth semiconductor layers are separated from each other in the third direction.

8 Claims, 38 Drawing Sheets

(51) Int. Cl.
*H01L 25/18* (2023.01)
*H10B 41/27* (2023.01)

(56) References Cited

U.S. PATENT DOCUMENTS

| | | |
|---|---|---|
| 2020/0350014 A1 | 11/2020 | Liu |
| 2021/0375900 A1 | 12/2021 | Zhang et al. |
| 2021/0375912 A1 | 12/2021 | Zhang et al. |

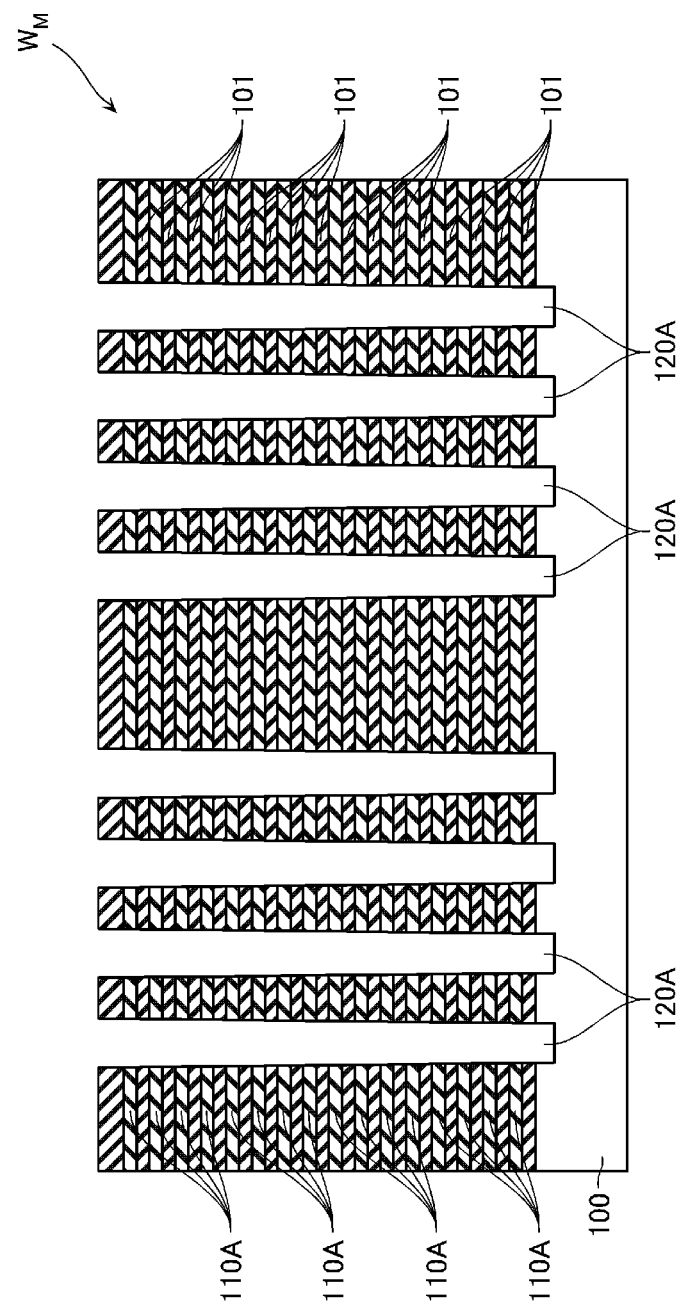
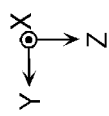
FIG. 9

SEMICONDUCTOR STORAGE DEVICE

CROSS-REFERENCE TO RELATED APPLICATION

This application is a continuation of U.S. patent application Ser. No. 17/188,575, filed Mar. 1, 2021, which is based upon and claims the benefit of priority from Japanese Patent Application No. 2020-146517, filed Sep. 1, 2020, the entire contents of each of which are incorporated herein by reference.

FIELD

Embodiments described herein relate generally to a semiconductor storage device.

BACKGROUND

A semiconductor storage device of one type includes a substrate, a plurality of conductive layers stacked in a direction intersecting a front surface of the substrate, a semiconductor layer facing the plurality of conductive layers, and a gate insulating layer provided between the conductive layer and the semiconductor layer. The gate insulating layer includes, for example, a memory unit capable of storing data such as an insulating charge storage layer (e.g., a silicon nitride ($Si_3N_4$) layer), or a conductive charge storage layer (e.g., a floating gate).

BRIEF DESCRIPTION OF THE DRAWINGS

FIGS. 8-22 illustrate schematic cross-sectional views of structures to describe a method of manufacturing a semiconductor storage device according to the first embodiment.

DETAILED DESCRIPTION

Figure 1:
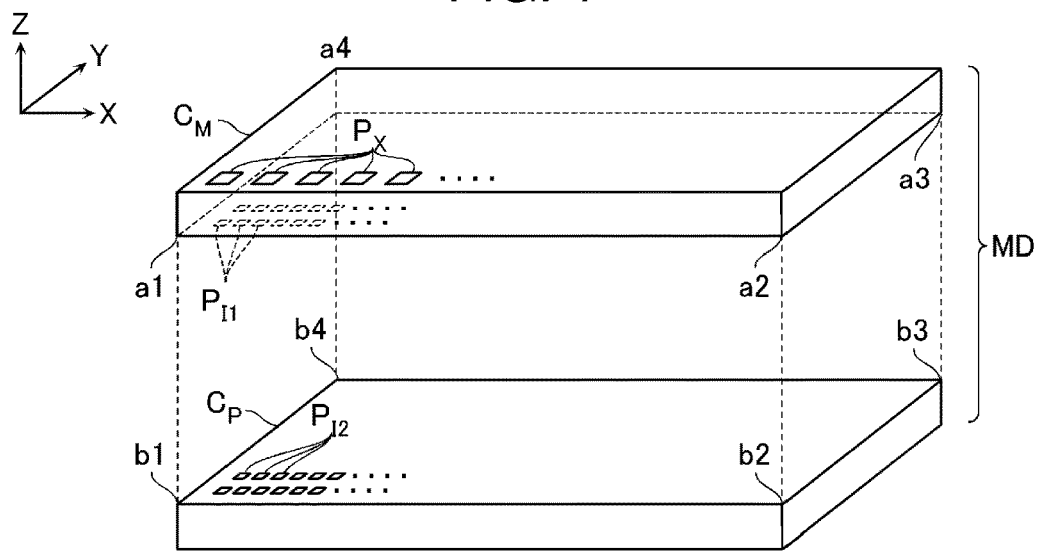
FIG. 1 illustrates a schematic perspective view of a configuration of a memory die MD according to a first embodiment.

Embodiments provide a semiconductor storage device capable of being suitably manufactured.

In general, according to an embodiment, a semiconductor storage device includes a substrate, first and second stacks, and first to fourth semiconductor layers. The first stack includes a plurality of first conductive layers and a plurality of first insulating layers alternately stacked in a first direction intersecting a surface of the substrate. The first semiconductor layer extends through the first stack in the first direction. The second semiconductor layer extends in a second direction generally parallel to the surface of the substrate above the first stack and electrically connected to the first semiconductor layer. The second stack includes a plurality of second conductive layers and a plurality of second insulating layers alternately stacked in the first direction. The first and second stacks are arranged in a third direction generally parallel to the surface of the substrate. The third semiconductor layer extends through the second stack in the first direction. The fourth semiconductor layer extends in the second direction above the second stack and electrically connected to the third semiconductor layer. The semiconductor storage device further includes a third conductive layer in contact with an upper surface of the second semiconductor layer and an upper surface of the fourth semiconductor layer. The second and fourth semiconductor layers extend in the second direction parallel to each other and are spaced from each other in the third direction.

According to another embodiment, a semiconductor storage device includes a substrate, first and second stacks, first to third semiconductor layers, and a first structure. The first stack includes a plurality of first conductive layers and a plurality of first insulating layers alternately stacked in a first direction intersecting a surface of the substrate. The first stack extends in a second direction generally parallel to the surface of the substrate. The first semiconductor layer extends through the first stack in the first direction. The second stack includes a plurality of second conductive layers and a plurality of second insulating layers alternately stacked in the first direction. The second stack extends in the second direction. The first and second stacks are adjacent to one another in a third direction generally parallel to the surface of the substrate. The second semiconductor layer extends through the second stack in the first direction. The first structure extends in the first and second directions. The first structure is provided between the first and second stacks in the third direction. The third semiconductor layer is above the first and second stacks and electrically connected to the first and second semiconductor layers. The semiconductor storage device further includes a third conductive layer in contact with an upper surface of the third semiconductor layer. A part of the third conductive layer is in contact with the first structure.

Next, a semiconductor storage device according to certain example embodiments will be described with reference to the drawings. The following embodiments are merely examples, and are not intended to limit the present disclosure. The drawings are schematic, and some aspects or components may be omitted from drawings for the sake of descriptive convenience. In general, the same reference symbols are given to aspects or components that are common to multiple embodiments, and the description of such repeated aspects or components may be omitted from later description.

The term "semiconductor storage device" used in the present specification can refer to both an individual memory die and a memory system including a memory die and a controller die such as a memory chip, a memory card, or a solid-state drive (SSD). The term "semiconductor storage device" also refers to a configuration such as a host computer (e.g., a smartphone, a tablet terminal, and a personal computer) incorporating a memory system or a memory die.

In the present specification, when a first component is said to be "electrically connected" to a second component, the first component may be directly connected to the second component, or the first component may be connected to the second component via an interconnection (e.g., wiring), a semiconductor member, a transistor, a switch-like element or the like. For example, when three transistors are connected in series, the first transistor is "electrically connected" to the third transistor even when the second transistor is in an OFF state.

In the present specification, one direction parallel to an upper surface of a substrate is referred to as an X direction, another direction which is parallel to the upper surface of the substrate and is perpendicular to the X direction is referred to as a Y direction, and a direction orthogonal to the upper surface of the substrate is referred to as a Z direction.

In the present specification, one direction along a predetermined surface is referred to as a first direction, another direction intersecting the first direction along the predetermined surface is referred to as a second direction, and a direction intersecting the predetermined surface is referred to as a third direction. The first direction, the second direction, and the third direction may or may not correspond to any of the X direction, the Y direction, and the Z direction.

In the present specification, expressions such as "upper" and "lower" are generally based on or referencing a distance from a substrate. For example, the direction going away from the substrate along the Z direction is referred to as up or upward, and the direction approaching towards the substrate along the Z direction is referred to as down, downward, or lower. When a lower surface or a lower end of a certain component are mentioned, this refers to a surface or an end of this component closest to and/or facing towards the substrate. When an upper surface or an upper end of a component are mentioned, this refers to a surface or an end of component farthest from the substrate and/or facing away from the substrate. A surface intersecting the X direction or the Y direction can be referred to as a side surface or the like.

In the present specification, a case where "width", "length", "thickness" or the like in a predetermined direction is described for a component, a particular portion of a component, or the like, this refers to a width, a length, a thickness, or the like of such component or portion as measured or observed by scanning electron microscopy (SEM), transmission electron microscopy (TEM), or the like. Such measurements or observations may be made on relevant device cross-sections or otherwise.

First Embodiment

Structure of Memory Die MD

FIG. 1 illustrates a schematic exploded perspective view of a configuration example of a semiconductor storage device according to the first embodiment. The semiconductor storage device according to the first embodiment includes a memory die MD. The memory die MD includes a chip $C_M$ including a memory cell array and a chip $C_P$ including a peripheral circuit.

A plurality of bonding pad electrodes $P_X$ is provided on an upper surface of the chip $C_M$. A plurality of first bonding electrodes $P_{I1}$ is provided on a lower surface of the chip $C_M$. A plurality of second bonding electrodes $P_{I2}$ is provided on an upper surface of the chip $C_P$. A surface of the chip $C_M$ on which the plurality of first bonding electrodes $P_{I1}$ is provided is referred to as a front surface, and a surface of the chip $C_M$ on which the plurality of bonding pad electrodes $P_X$ is provided is referred to as a rear surface. For the chip $C_P$, a surface on which the plurality of second bonding electrodes $P_{I2}$ is provided is referred to as a front surface, and a surface opposite to the front surface is referred to as a rear surface. In the illustrated example of FIG. 1, the front surface of the chip $C_P$ is provided above the rear surface of the chip $C_P$, but the rear surface of the chip $C_M$ is provided above the front surface of the chip $C_M$.

The chip $C_M$ and the chip $C_P$ are provided such that the front surface of the chip $C_M$ and the front surface of the chip $C_P$ face each other. The plurality of first bonding electrodes $P_{I1}$ is provided corresponding to the plurality of second bonding electrodes $P_{I2}$, and is provided at locations bondable to the plurality of second bonding electrodes $P_{I2}$. The first bonding electrodes $P_{I1}$ and the second bonding electrodes $P_{I2}$ are bonded to the chip $C_M$ and the chip $C_P$, and function as bonding electrodes for electrical connection. The bonding pad electrodes $P_X$ function as electrodes for electrically connecting the memory die MD to a controller die or the like.

In the example of FIG. 1, corners a1, a2, a3, and a4 of the chip $C_M$ correspond to corners b1, b2, b3, and b4 of the chip $C_P$, respectively.

Figure 2:
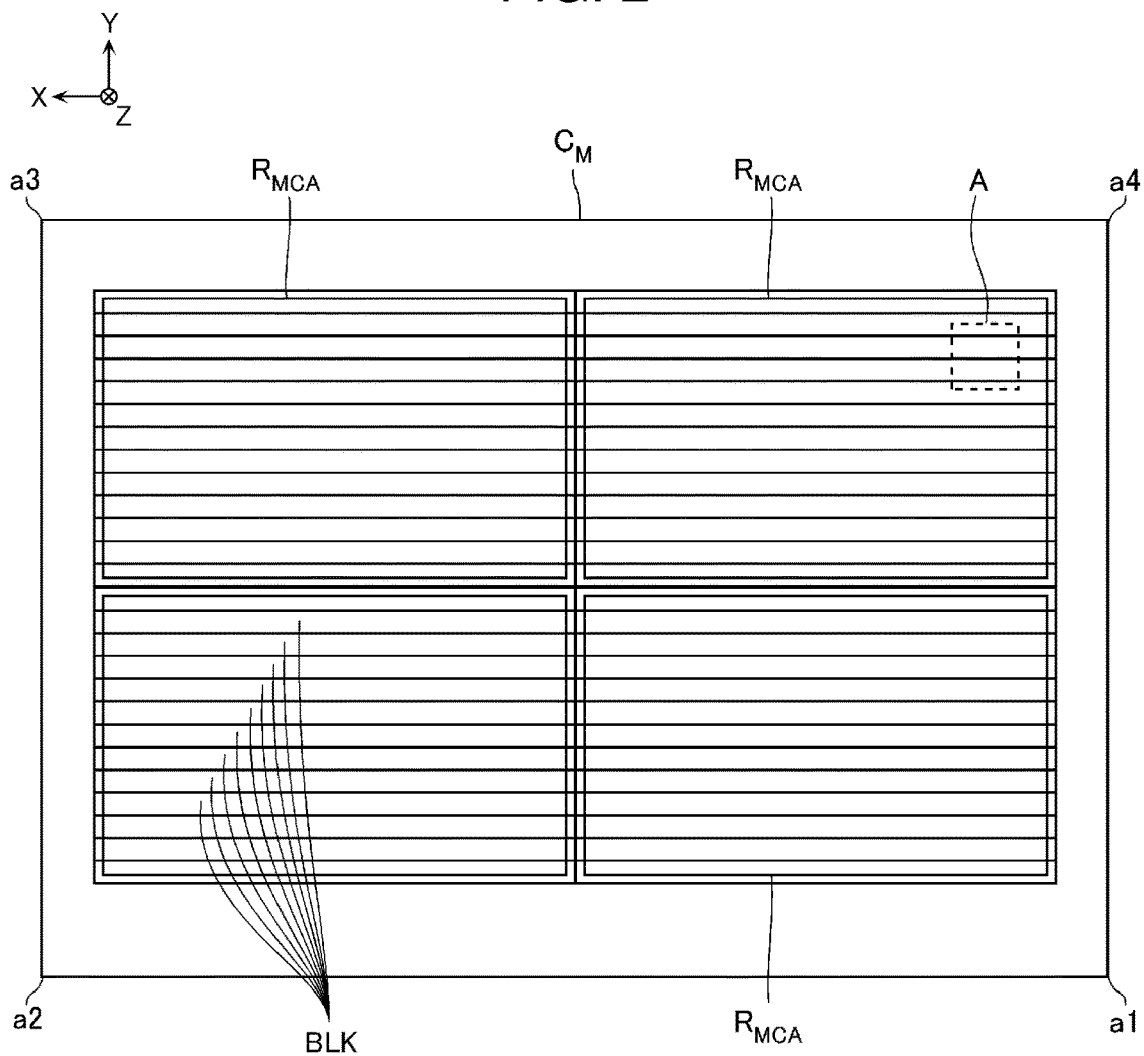
FIG. 2 illustrates a schematic bottom view of a configuration of a chip $C_M$.
Figure 3:
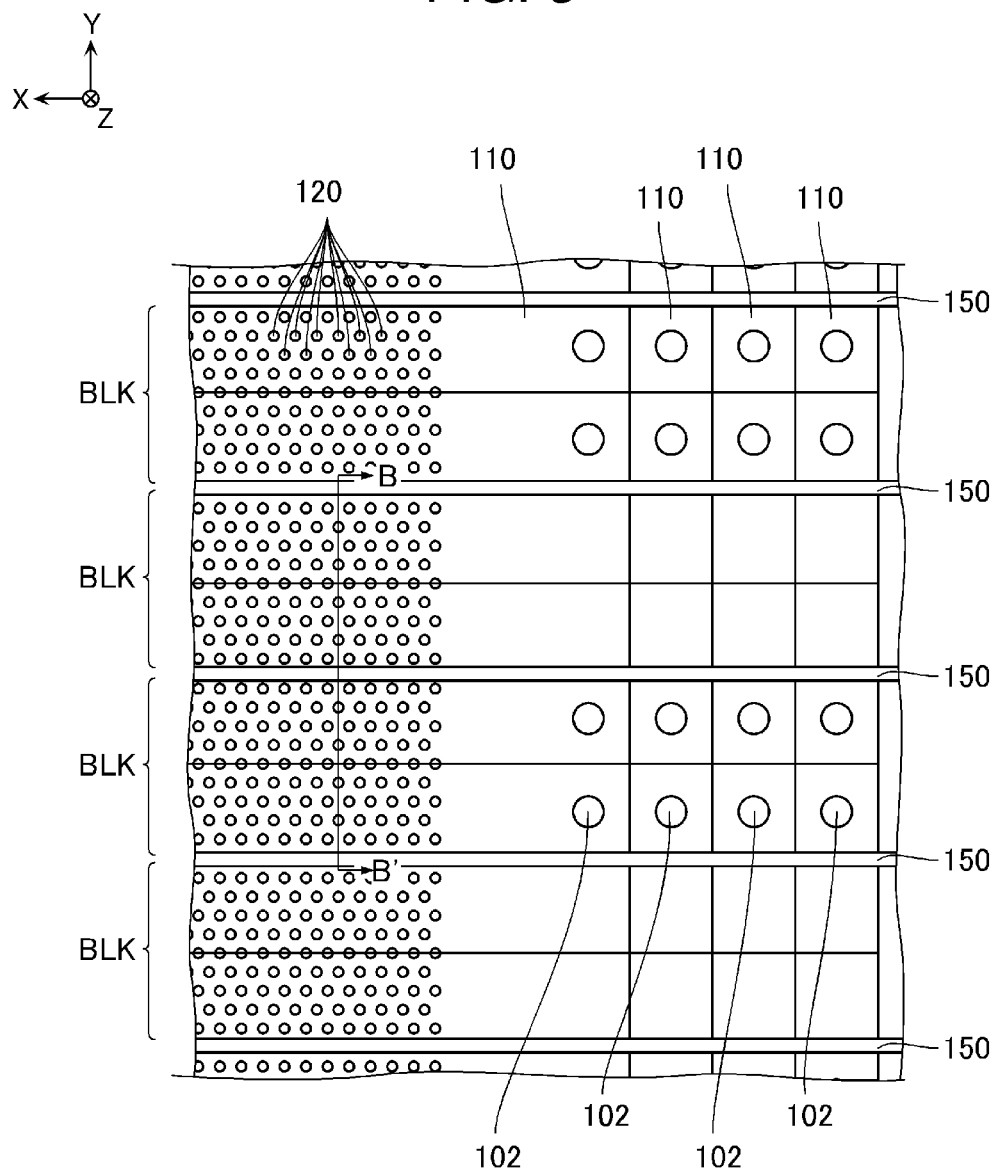
FIG. 3 illustrates a schematic bottom view of a configuration of a part of the chip $C_M$.
Figure 4:
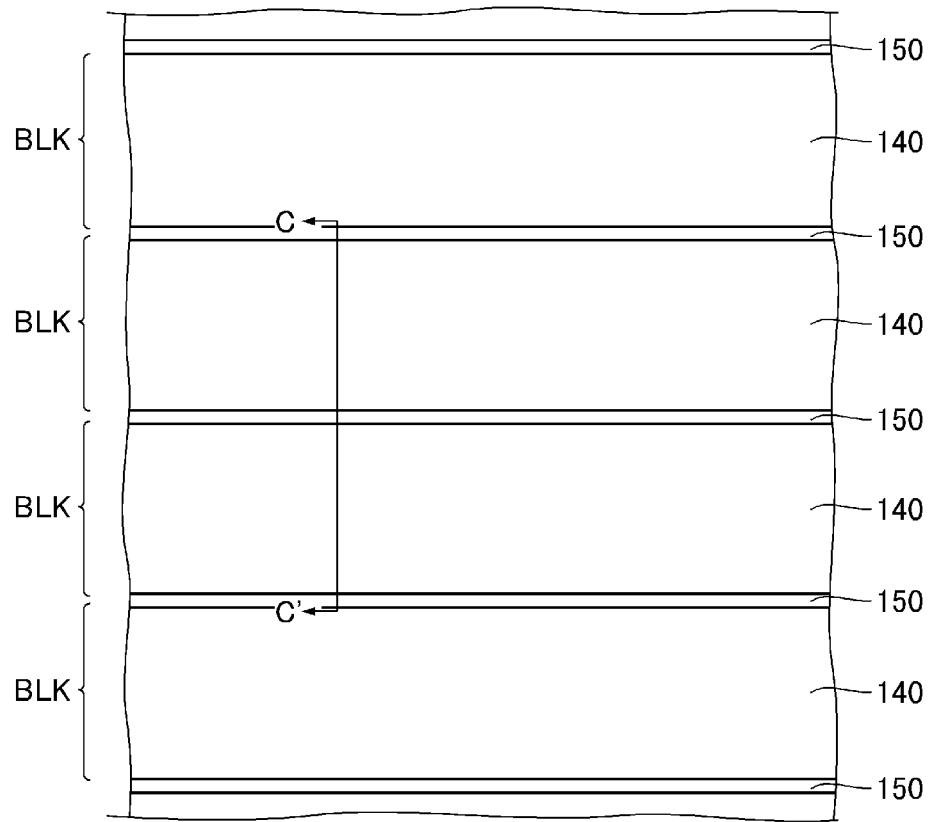
FIG. 4 illustrates a schematic plan view of a configuration of a part of a chip $C_M$.
Figure 5:
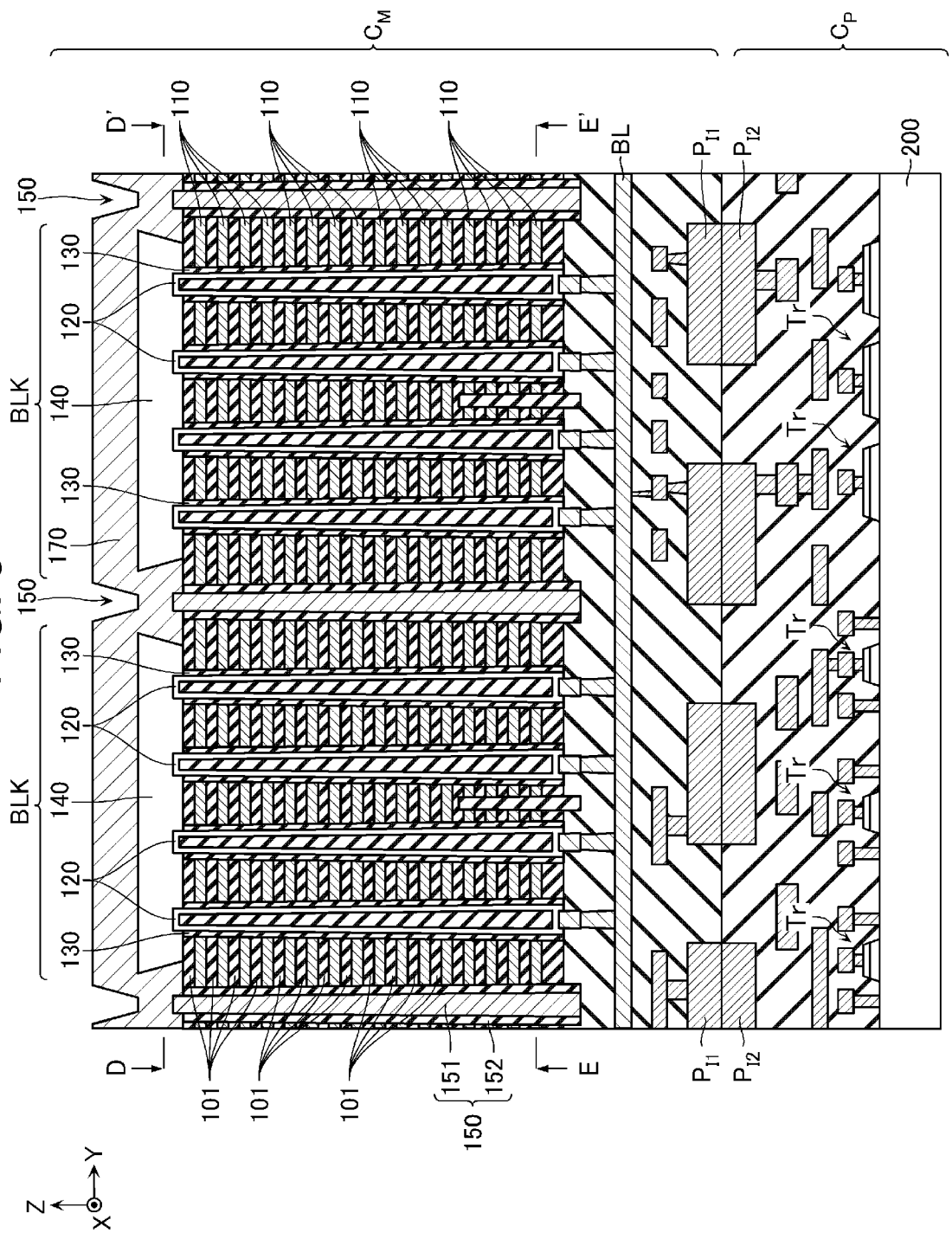
FIG. 5 illustrates a schematic cross-sectional view of a configuration of a part of the chip $C_M$.
Figure 6:
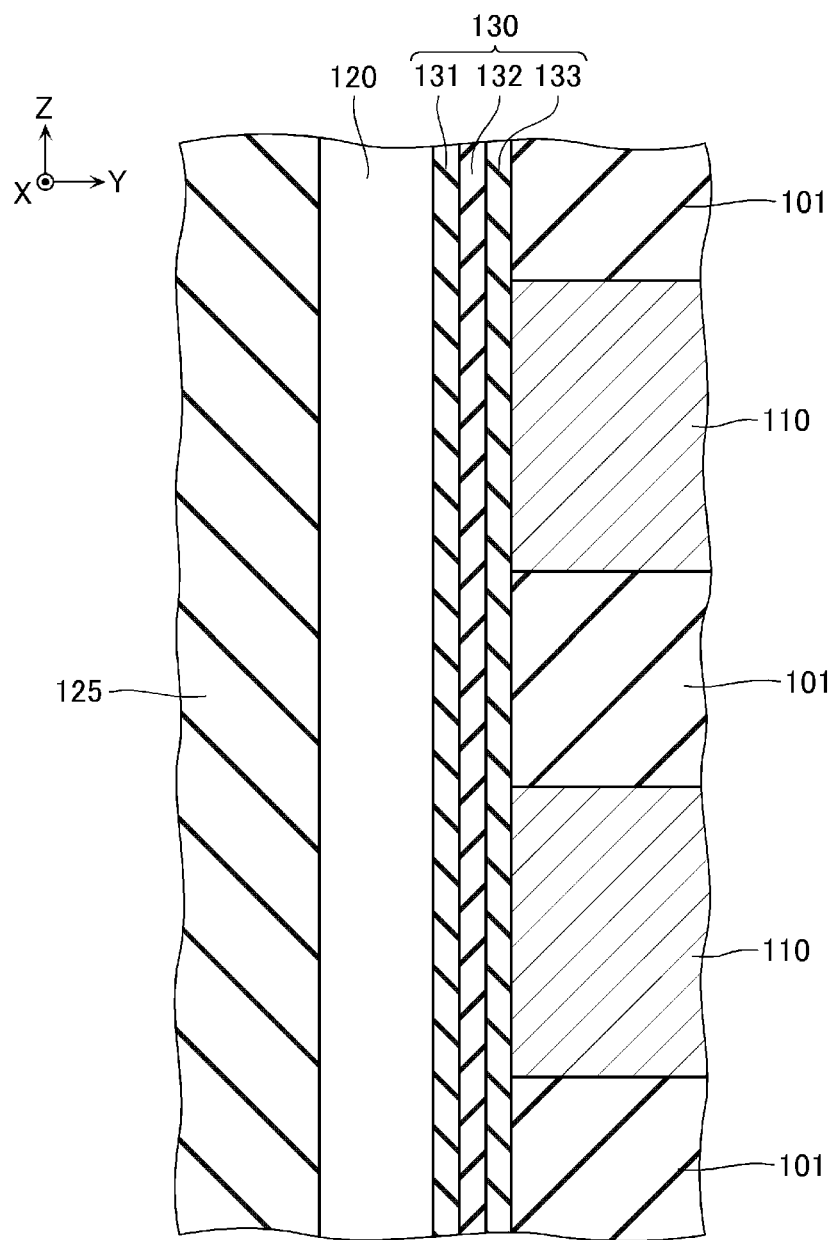
FIG. 6 illustrates a schematic enlarged cross-sectional view of a configuration of a part of FIG. 5.
Figure 7:
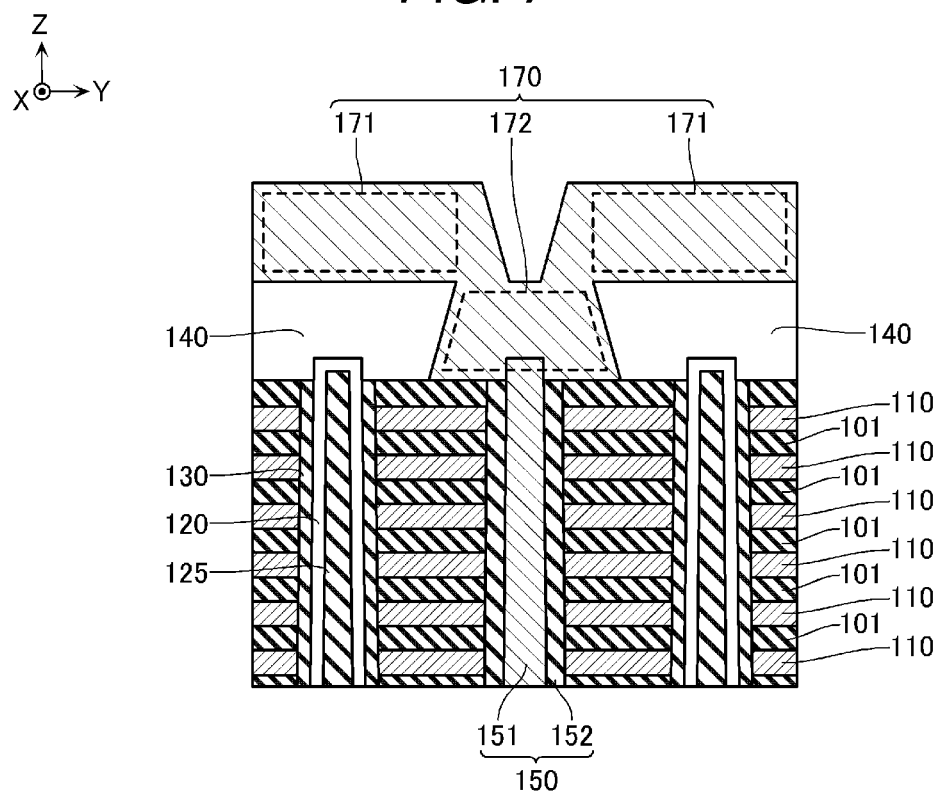
FIG. 7 illustrates a schematic enlarged cross-sectional view of a configuration of a part of FIG. 5.

FIG. 2 illustrates a schematic bottom view of a configuration example of the chip $C_M$. FIG. 3 illustrates a schematic enlarged bottom view of a configuration of a portion of the chip $C_M$ indicated by A. FIG. 4 illustrates a schematic enlarged plan view of a configuration of a part of the chip $C_M$. FIG. 5 illustrates a schematic cross-sectional view of a configuration of a part of the chip $C_M$. FIG. 3 corresponds to a cross section of a structure shown in FIG. 5 cut along a line E-E' and viewed along a direction of an arrow. FIG. 4 corresponds to a cross section of the structure shown in FIG. 5 cut along a line D-D' and viewed along a direction of an arrow. FIG. 5 corresponds to a cross section of a structure shown in FIG. 3 cut along a line B-B' and viewed along a direction of an arrow. FIG. 5 corresponds to a cross section of a structure shown in FIG. 4 cut along a line C-C' and viewed along a direction of an arrow. FIG. 5 corresponds to a cross section of the structure shown in FIG. 4 cut along the line C-C' and viewed along the direction of the arrow. FIGS. 6 and 7 illustrate schematic enlarged cross-sectional views of a configuration of a part of FIG. 5.

Structure of Chip $C_M$

The chip $C_M$ includes, for example, four memory cell array regions $R_{MCA}$ arranged in the X and Y directions as shown in FIG. 2. The memory cell array region $R_{MCA}$ includes a plurality of memory blocks BLK arranged in the Y direction, a plurality of inter-block structures 150 (FIG. 3) provided between the plurality of memory blocks BLK, and a conductive layer 170 (FIG. 5) provided on upper surfaces of the plurality of memory blocks BLK and the plurality of inter-block structures 150.

As shown in FIG. 5, the memory block BLK includes, for example, a plurality of conductive layers 110 arranged in the Z direction, a plurality of semiconductor layers 120 extending in the Z direction, a plurality of gate insulating films 130 provided between the plurality of conductive layers 110 and the plurality of semiconductor layers 120, and a semiconductor layer 140 connected to upper ends of the plurality of semiconductor layers 120.

Each conductive layer 110 is a plate-shaped conductive layer extending in the X direction. The conductive layers 110 may each include a stacked film of a barrier conductive film such as titanium nitride (TiN) and a metal film such as tungsten (W), and the like. A conductive layer 110 may comprise, for example, polycrystalline silicon or the like doped with impurities such as phosphorus (P) and boron (B). Insulating layers 101 such as silicon oxide ($SiO_2$) are provided between the conductive layers 110 in the Z direction.

A conductive layer 110 functions as, for example, a word line, gate electrodes of a plurality of memory cells connected to the word line, and the like. The conductive layer 110 is connected to, for example, a contact 102 at one end in the X direction as shown in FIG. 3. The conductive layer 110 is connected to a configuration inside the chip $C_P$ via the contact 102 and the first bonding electrode $P_{I1}$.

For example, the semiconductor layers 120 are arranged in a predetermined pattern in the X direction and the Y direction as shown in FIG. 3. The semiconductor layer 120 functions as, for example, a channel region of the plurality of memory cells, and the like. The semiconductor layer 120 is, for example, a semiconductor layer such as polycrystalline silicon (Si). As shown in FIG. 5, the semiconductor layer 120 has, for example, a cylindrical shape, and an insulating layer 125 (see FIG. 6) such as silicon oxide is provided at a central portion thereof. An outer peripheral surface of each of the semiconductor layers 120 is surrounded by the conductive layer 110 and faces the conductive layer 110.

An impurity region containing N-type impurities such as phosphorus (P) is provided at a lower end of the semiconductor layer 120. This impurity region is electrically connected to a bit line BL. The bit line BL is electrically connected to the components inside the chip $C_P$ via the first bonding electrode Pr.

An impurity region containing N-type impurities such as phosphorus (P) or P-type impurities such as boron (B) is provided at an upper end of the semiconductor layer 120. This impurity region is electrically connected to the semiconductor layer 140. The semiconductor layer 140 is electrically connected to the components inside the chip $C_P$ via the conductive layer 170, a conductive layer 151, and the first bonding electrode Pr.

The gate insulating film 130 has a cylindrical shape that covers the outer peripheral surface of the semiconductor layer 120. As shown in FIG. 6, the gate insulating film 130 includes, for example, a tunnel insulating film 131, a charge storage film 132, and a block insulating film 133 stacked between the semiconductor layer 120 and the conductive layer 110. The tunnel insulating film 131 and the block insulating film 133 are, for example, insulating films such as silicon oxide ($SiO_2$). The charge storage film 132 is, for example, a film capable of storing charges such as silicon nitride ($Si_3N_4$). The tunnel insulating film 131, the charge storage film 132, and the block insulating film 133 have a cylindrical shape, and extend in the Z direction along the outer peripheral surface of the semiconductor layer 120.

FIG. 6 shows an example in which the gate insulating film 130 includes the charge storage film 132 such as silicon nitride. However, the gate insulating film 130 may include, for example, a floating gate formed of polycrystalline silicon doped with N-type or P-type impurities.

As shown in FIG. 4, the semiconductor layer 140 is, for example, a plate-shaped semiconductor layer extending in the X direction. The semiconductor layer 140 is connected to the upper ends of all the semiconductor layers 120 in a memory block BLK. The semiconductor layer 140 may comprise, for example, polycrystalline silicon containing impurities such as phosphorus (P) and boron (B).

As shown in FIG. 7, both side surfaces of the semiconductor layer 140 in the Y direction tilt at an angle such that lower portions become farther from the adjacent semiconductor layer 140 above the adjacent memory block BLK and upper portions become closer to the adjacent semiconductor layer 140. That is, the distance between the lower surfaces of two semiconductor layers 140 adjacent to each other in the Y direction is longer than the distance between the upper surfaces of the two adjacent semiconductor layers 140. In other words, the side surfaces of each semiconductor layer 140 are reverse-tapered.

The inter-block structure 150 includes a conductive layer 151 extending in the Z direction and the X direction and insulating layers 152, such as silicon oxide ($SiO_2$), provided on side surfaces of the conductive layer 151 in the Y direction. The conductive layer 151 may comprise, for example, a stacked film of a barrier conductive film such as titanium nitride (TiN) and a metal film such as tungsten (W), or the like. The conductive layer 151 functions, for example, as a part of a source line.

The conductive layer 170 may comprise, for example, a stacked film of a barrier conductive film such as titanium nitride (TiN) and a metal film such as copper (Cu) or aluminum (Al), or the like. The conductive layer 170 functions, for example, as a part of the source line.

As shown in FIG. 7, the conductive layer 170 comprises, for example, a plurality of portions 171, each provided corresponding to one of the plurality of memory blocks BLK, and a plurality of portions 172, each provided corresponding to one of the plurality of inter-block structures 150. A portion 171 is a substantially plate-shaped portion that is joined to the upper surface of a semiconductor layer 140 and extends in the X direction so as to correspond to the semiconductor layer 140. A portion 172 is connected to an upper end of the conductive layer 151. The portion 172 is also joined to the side surfaces of adjacent semiconductor layers 140 in the Y direction.

A lower surface of the portion 172 (a contact surface with the insulating layer 101) is located below a lower surface of the portion 171 of the conductive layer 170 (a joining surface with the semiconductor layer 140). An upper surface of the portion 172 of the conductive layer 170 is located below an upper surface of the portion 171 of the conductive layer 170.

Structure of Chip $C_P$

As shown in FIG. 5, the chip $C_P$ includes a semiconductor substrate 200 and a plurality of transistors Tr provided on a front surface of the semiconductor substrate 200. The plurality of transistors Tr is connected to the components inside the chip C<sub>M</sub> via the second bonding electrode P<sub>I2</sub>. The plurality of transistors functions as a peripheral circuit used for controlling the memory cell array. For example, in a read operation, this peripheral circuit supplies a voltage to a current path including a bit line BL, a semiconductor layer 120, a semiconductor layer 140, a conductive layer 170, and a conductive layer 151 and determines data recorded in the memory cell depending on whether or not a current flows or the like.

Manufacturing Method

Next, a method of manufacturing the memory die MD will be described with reference to FIGS. 8 to 22. FIGS. 8 to 22 are schematic cross-sectional views showing the manufacturing method, and show the configuration corresponding to FIG. 5.

Figure 8:
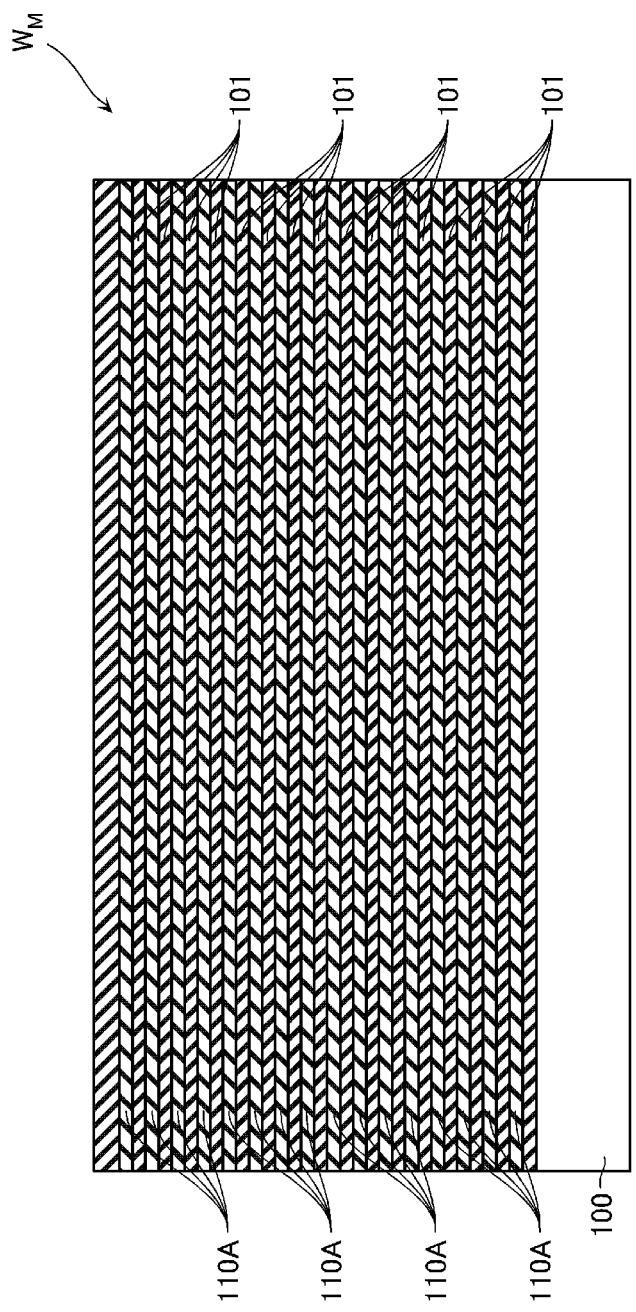

In manufacturing the memory die MD according to the present embodiment, as shown in FIG. 8, a plurality of sacrificial layers 110A and the insulating layers 101 are formed on a semiconductor substrate 100 portion of a wafer W<sub>M</sub>. The sacrificial layer 110A is made of, for example, silicon nitride ($Si_3N_4$) or the like. This process is performed by, for example, a method such as chemical vapor deposition (CVD).

As shown in FIG. 9, a plurality of through via holes 120A is then formed at locations corresponding to the semiconductor layers 120. The through via hole 120A is a through via hole that extends in the Z direction, penetrates the insulating layers 101 and the sacrificial layers 110A, and exposes the upper surface of the semiconductor substrate 100. This process is performed by, for example, a method such as reactive ion etching (RIE).

Figure 10:
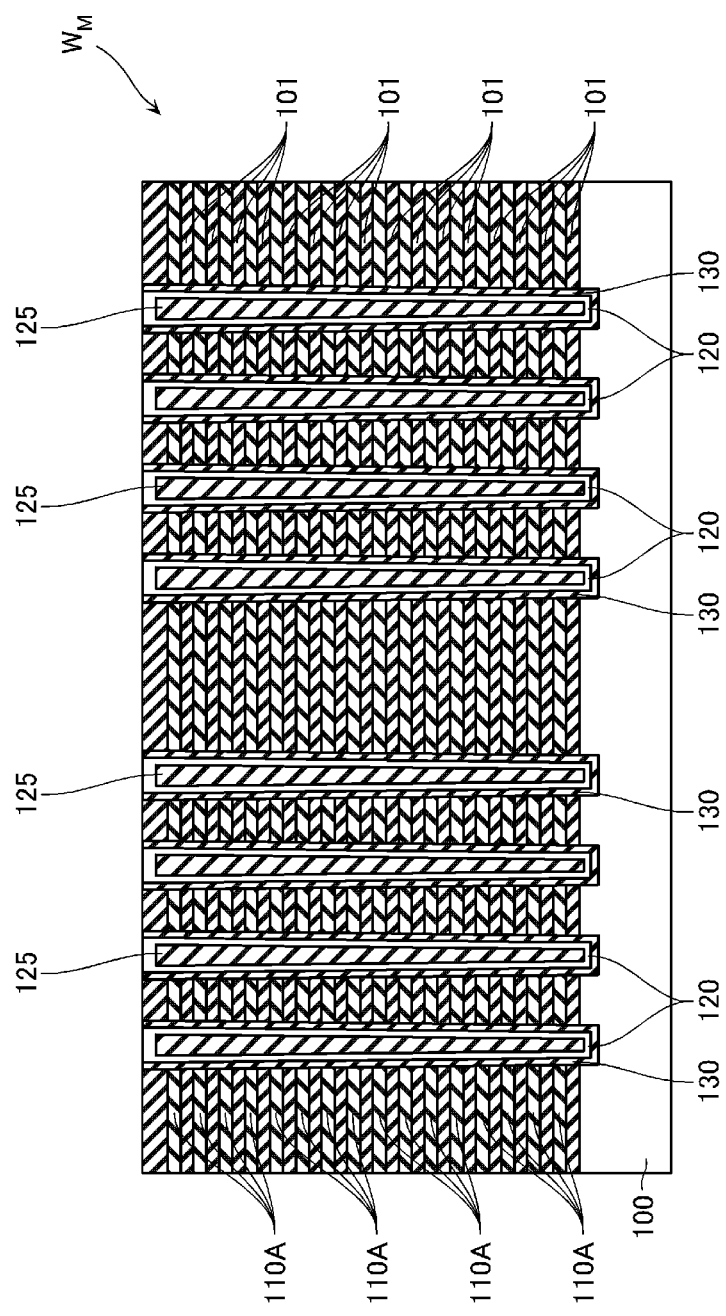

As shown in FIG. 10, the gate insulating film 130, the semiconductor layer 120, and the insulating layer 125 are formed on an inner peripheral surface of the through via hole 120A. This process is performed by, for example, a method such as CVD.

Figure 11:
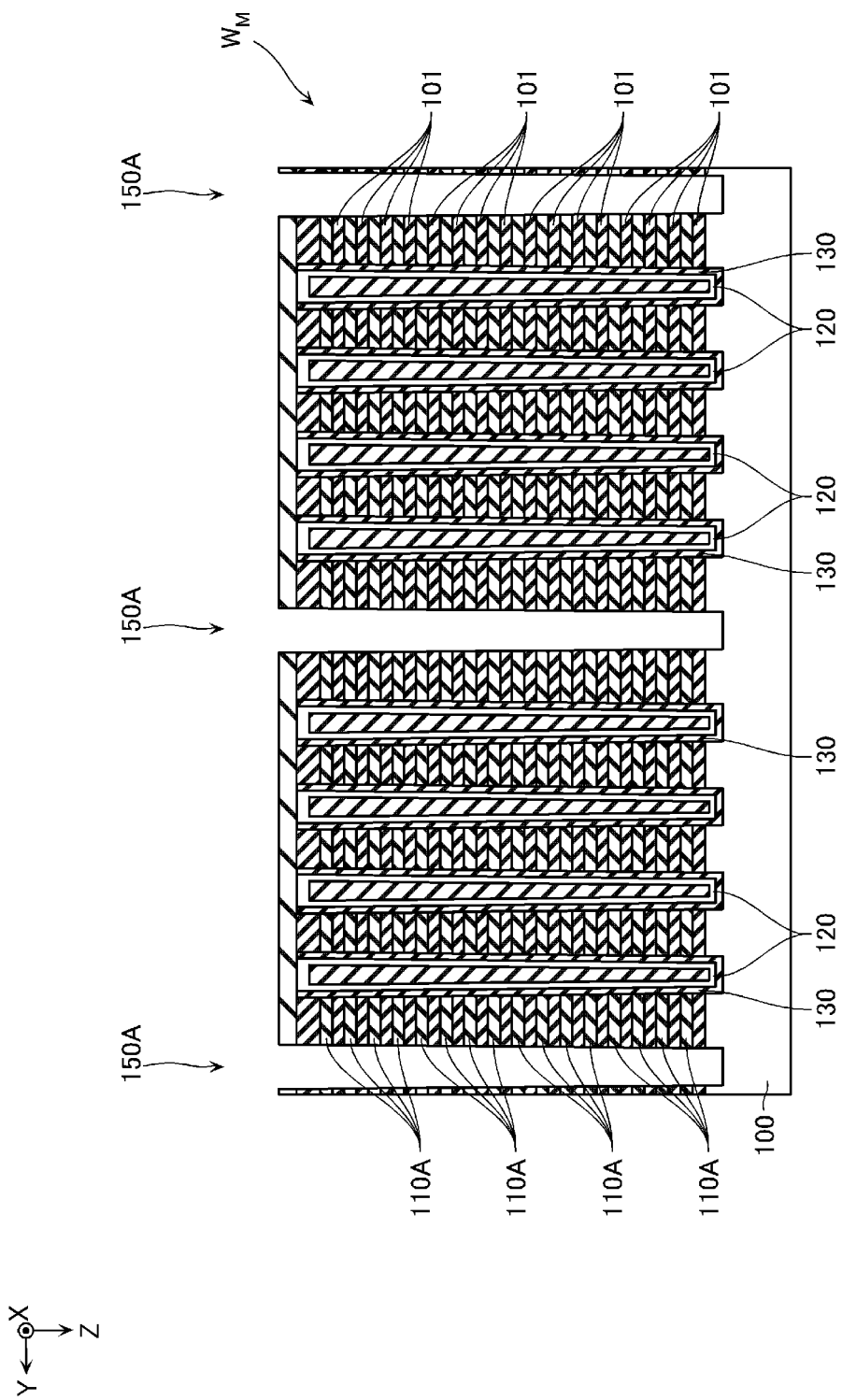

Subsequently, grooves 150A are formed, as shown in FIG. 11. Each groove 150A is a groove that extends in the Z direction and the X direction and divides the insulating layers 101 and the sacrificial layers 110A in the Y direction. The groove 150A also exposes the upper surface of the semiconductor substrate 100. This process is performed by, for example, a method such as RIE.

Figure 12:
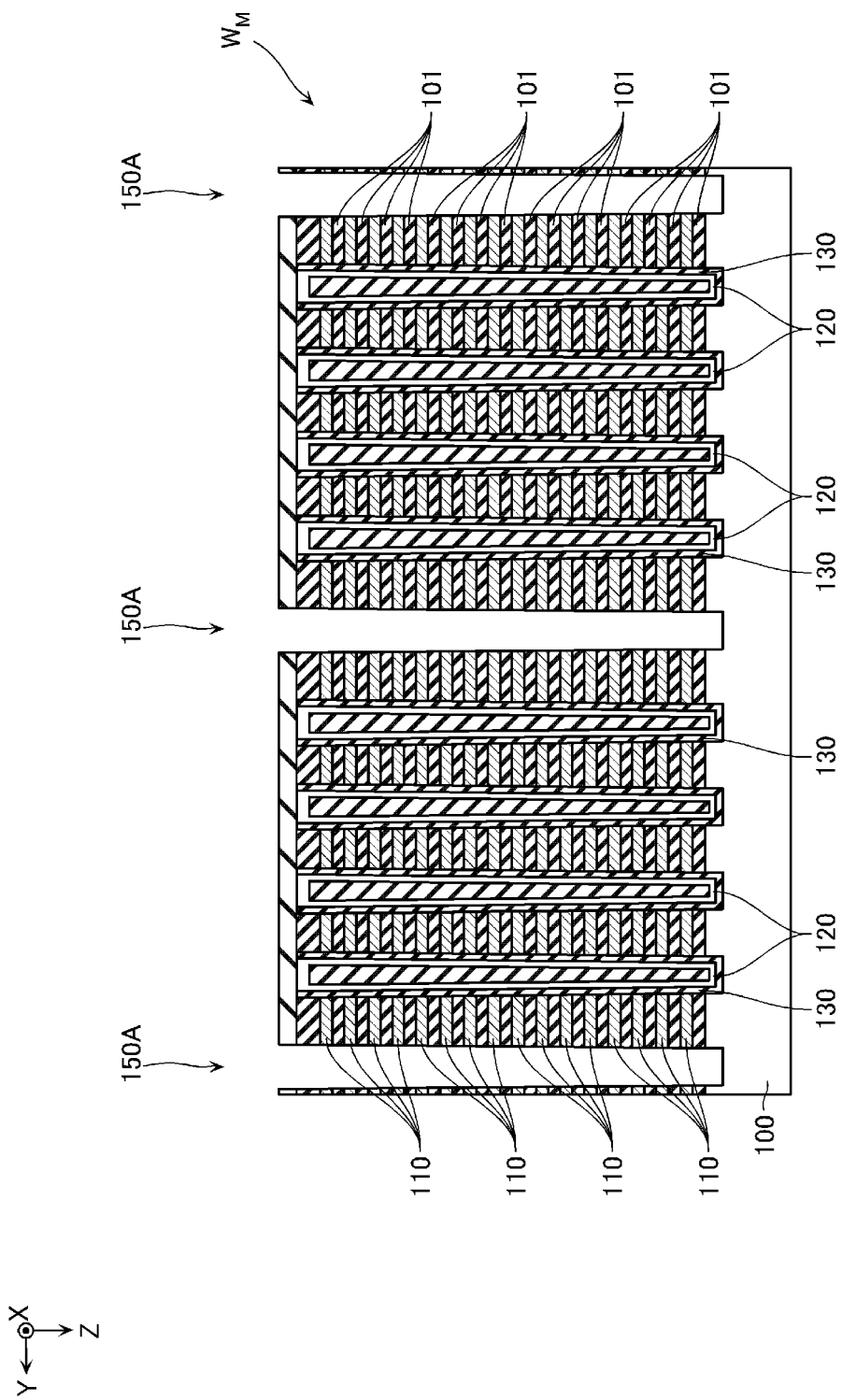

Next, the conductive layers 110 are formed, as shown in FIG. 12. In this process, the sacrificial layers 110A are removed via the grooves 150A by a method such as wet etching, for example. The conductive layers 110 are formed by a method such as CVD.

Figure 13:
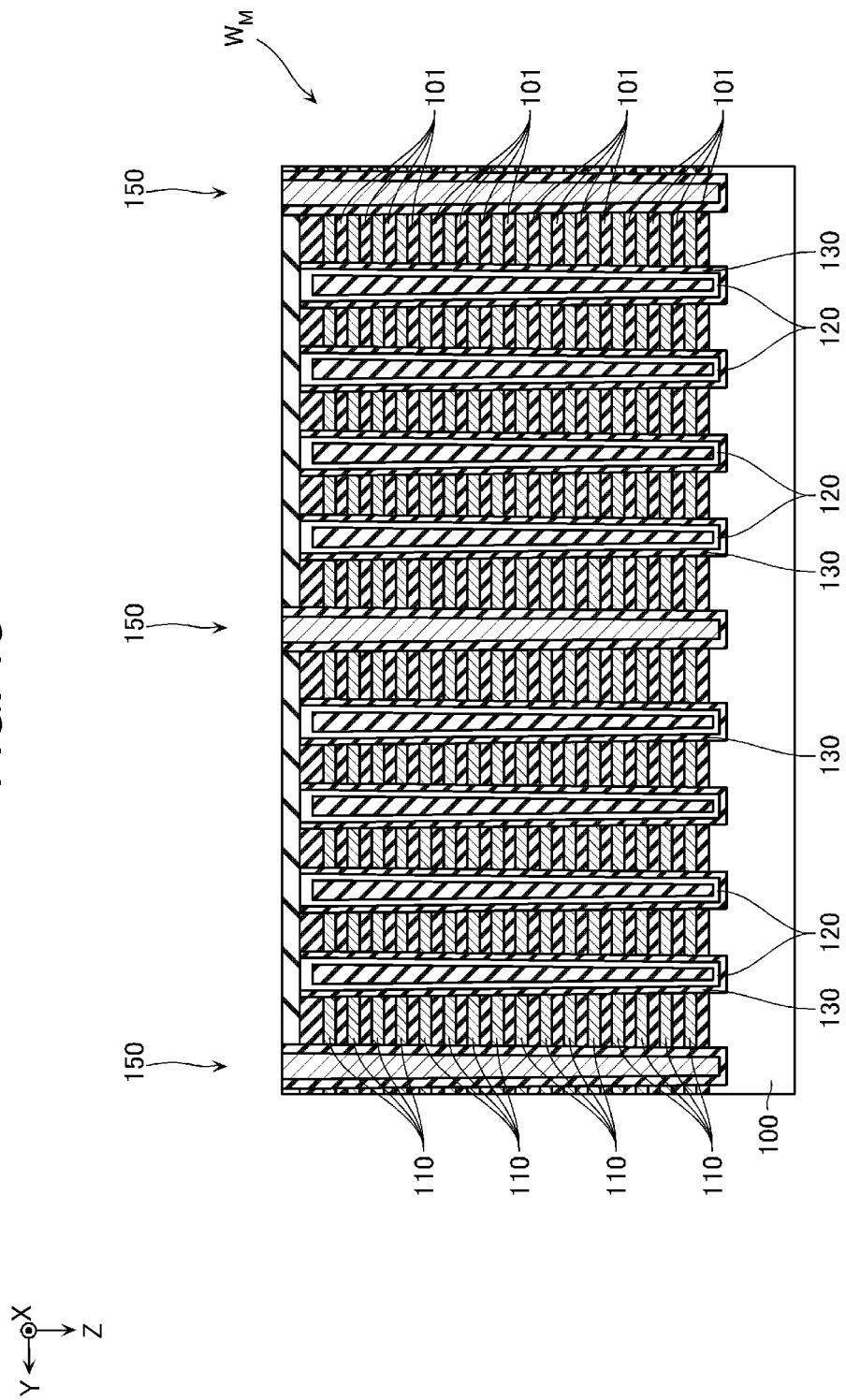

The inter-block structures 150 are formed in the grooves 150A, as shown in FIG. 13. This process is performed by, for example, a method such as CVD or RIE.

Figure 14:
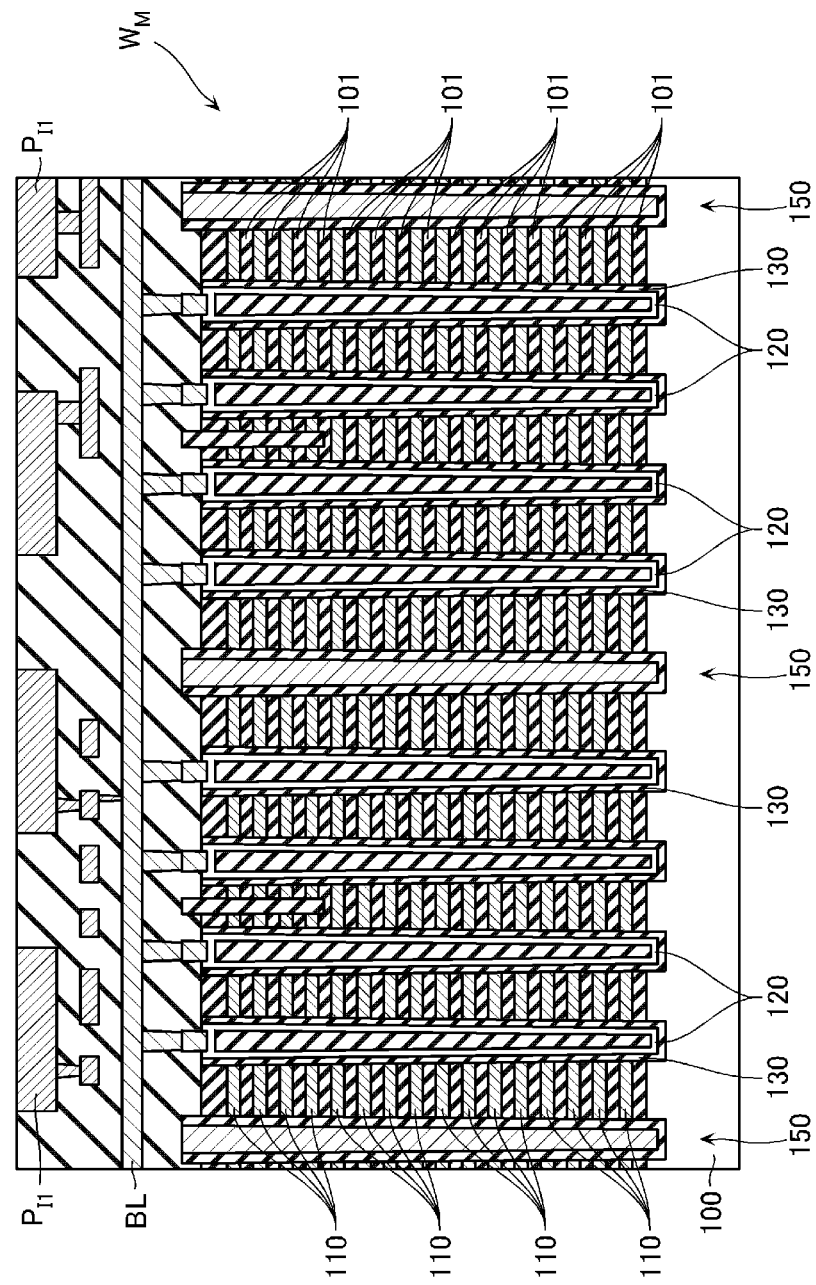

The bit lines BL, the first bonding electrodes P<sub>I1</sub>, and the like are formed, as shown in FIG. 14. This process is performed by, for example, a method such as CVD, photolithography, and etching.

Figure 15:
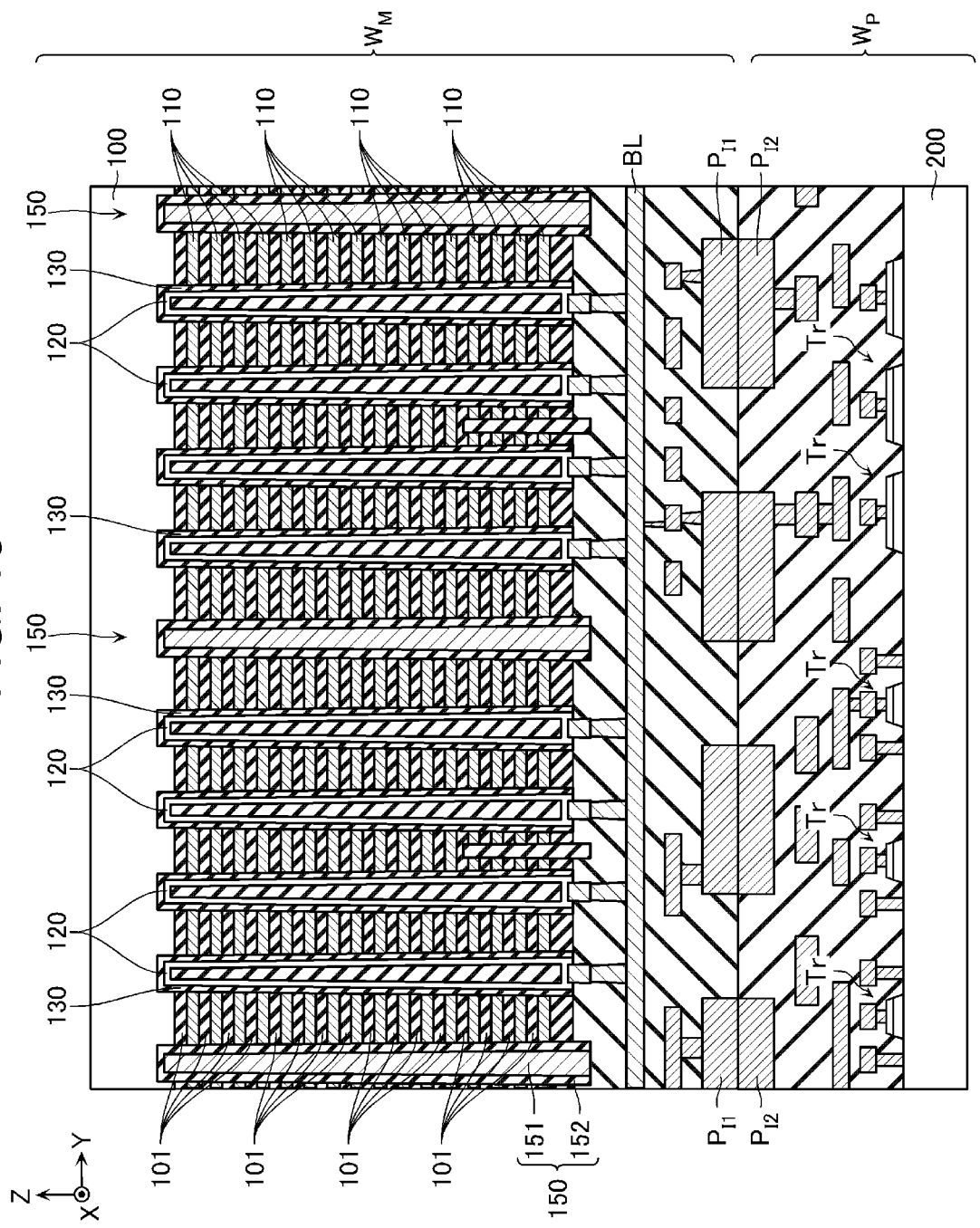

Subsequently, the wafer W<sub>M</sub> (corresponding to the chip C<sub>M</sub>) and a wafer W<sub>P</sub> (corresponding to the chip C<sub>P</sub>) are bonded, as shown in FIG. 15. In this bonding process, the wafer W<sub>M</sub> comes into close contact with the wafer W<sub>P</sub> by pressing the wafer W<sub>M</sub> toward the wafer W<sub>P</sub>, and heat treatment or the like is performed on the contacting wafers. As a result, the wafer W<sub>M</sub> is bonded to the wafer W<sub>P</sub> via the first bonding electrodes P<sub>I1</sub> and the second bonding electrodes P<sub>I2</sub>.

Figure 16:
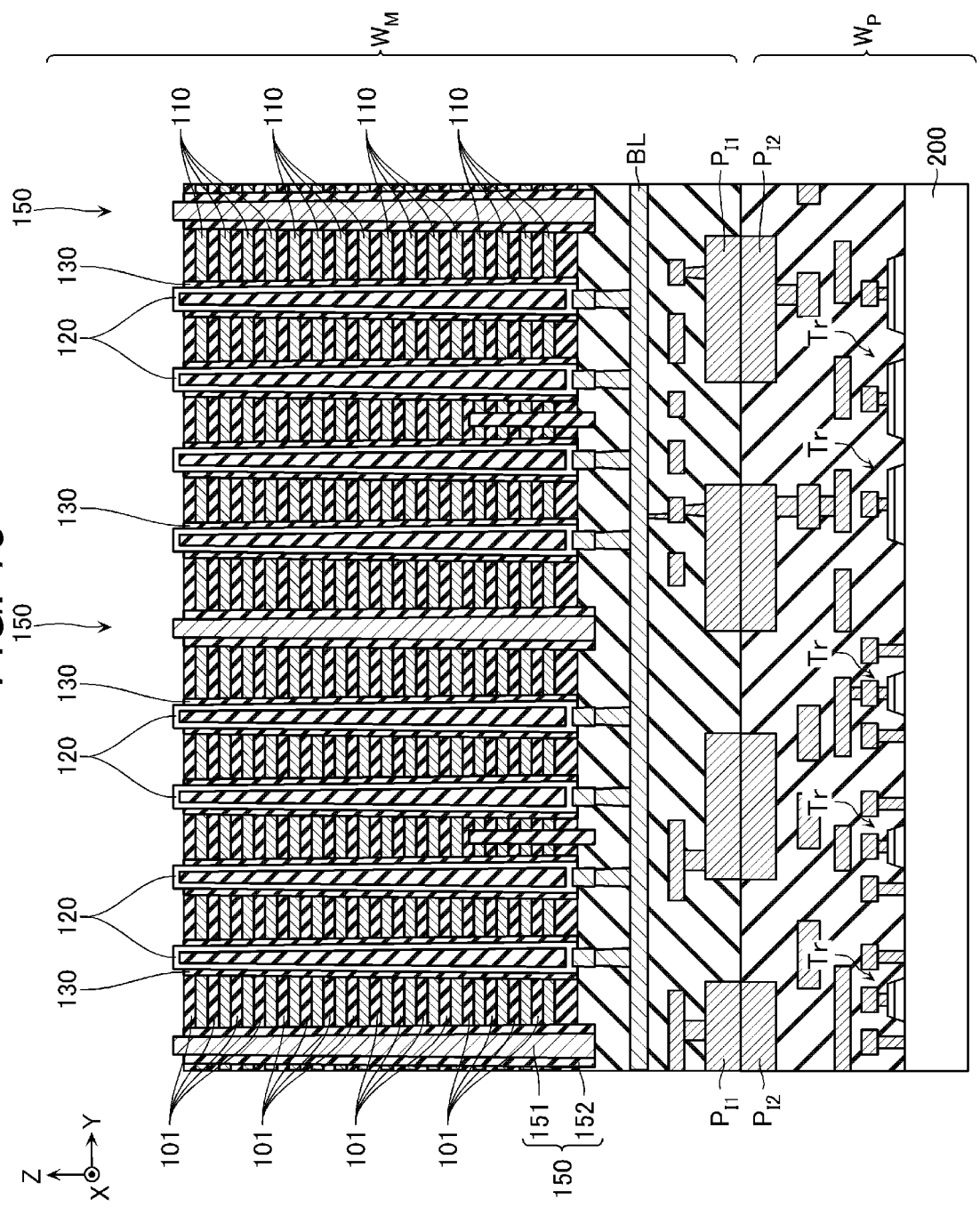

The semiconductor substrate 100 (which is a sub-portion of the wafer W<sub>M</sub>) is subsequently removed as shown in FIG. 16. Parts of the gate insulating films 130 and the insulating layers 152 are removed, and thus, the upper ends of the semiconductor layers 120 and the conductive layers 151 are exposed. This process is performed by selectively removing parts of the semiconductor substrate 100 and the gate insulating films 130 and the insulating layers 152 by, for example, a method such as wet etching or RIE.

Figure 17:
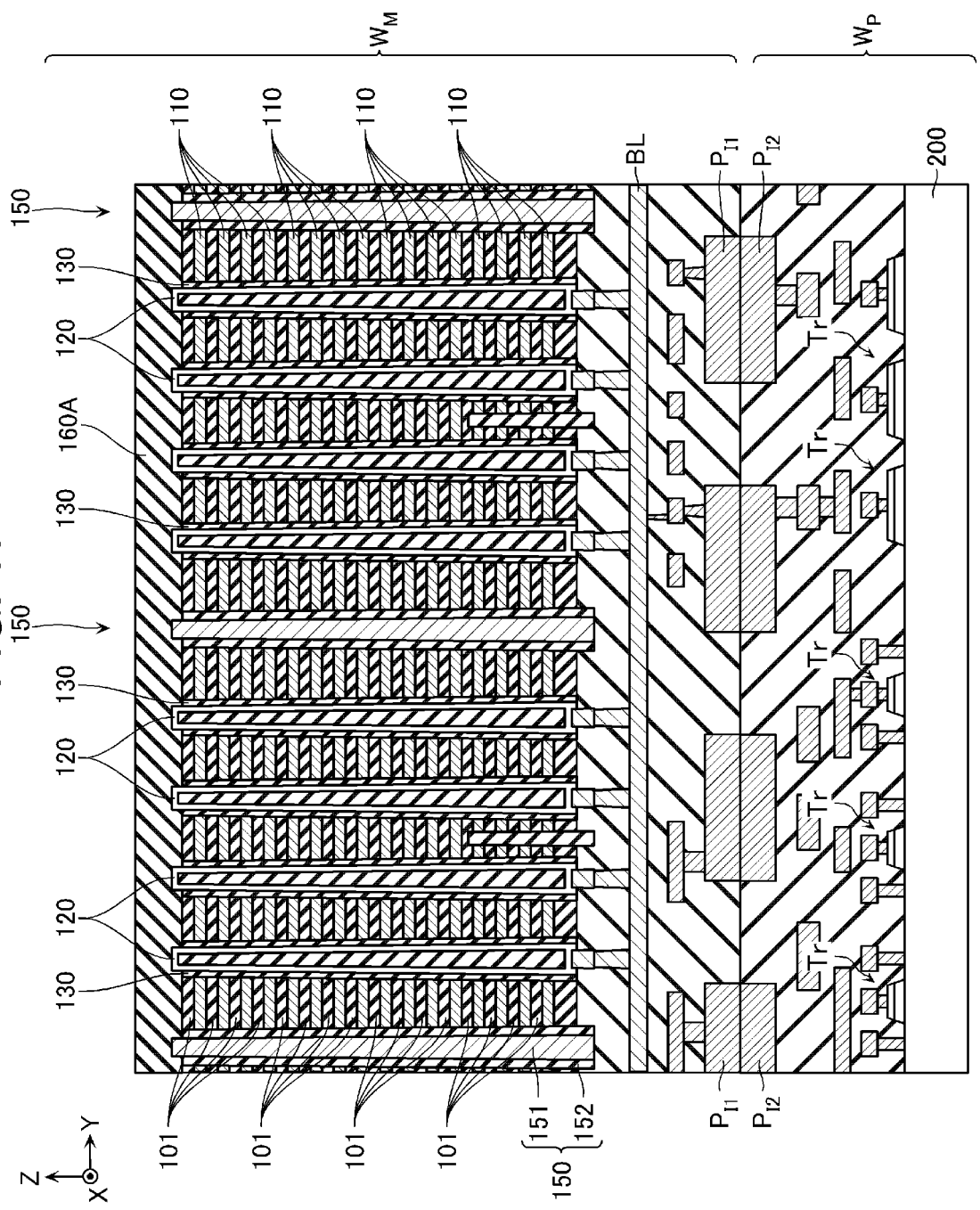

Subsequently, an insulating layer 160A covering an upper surface of the structure depicted in FIG. 16 is formed as shown in FIG. 17. The insulating layer 160A comprises, for example, silicon oxide ($SiO_2$) or the like. This process is performed by, for example, a method such as CVD.

Figure 18:
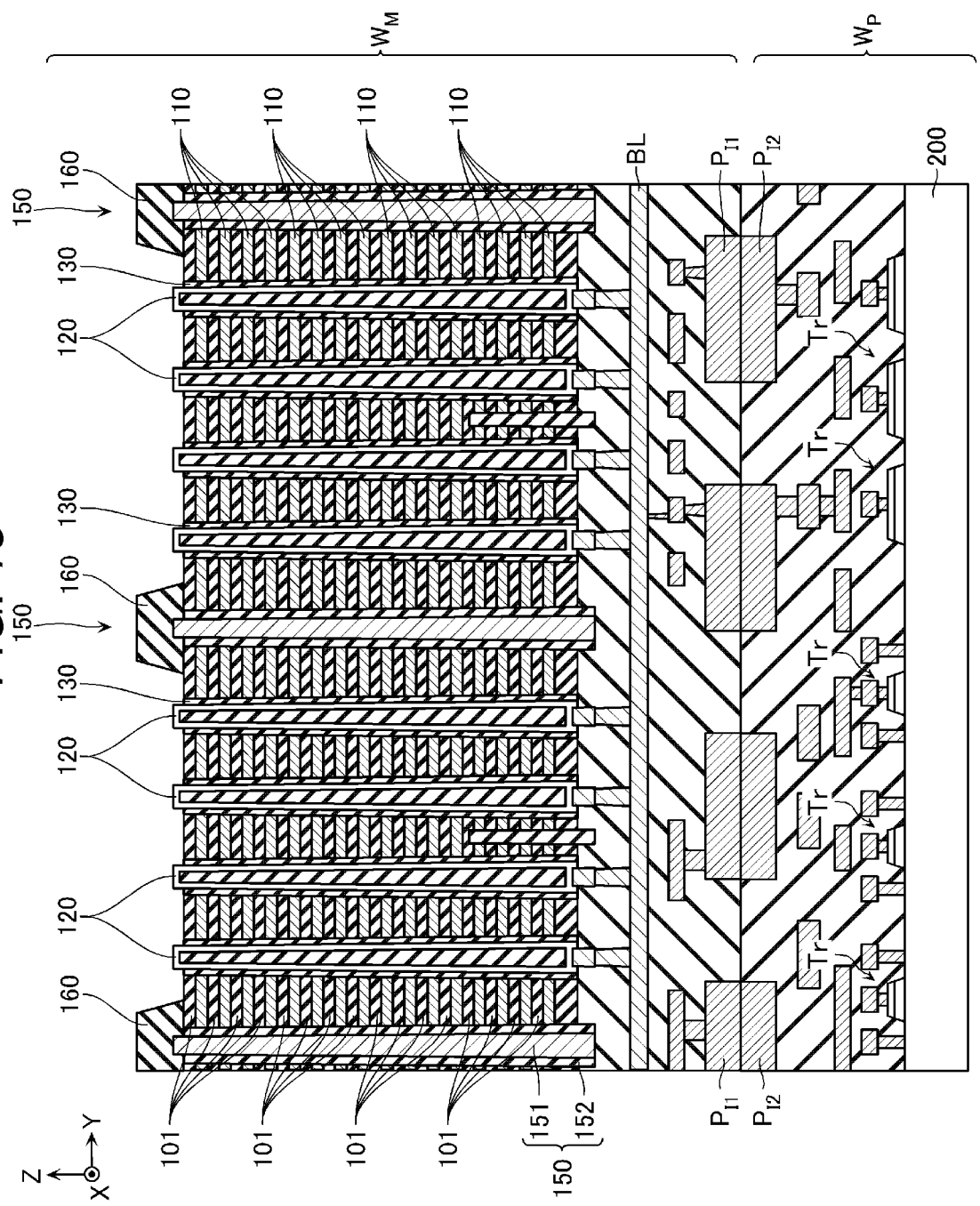

The upper ends of the plurality of semiconductor layers 120 are exposed by removing portions of the insulating layer 160A corresponding to the memory blocks BLK, as shown in FIG. 18. As a result, a plurality of insulating layers 160 covering the upper ends of the conductive layers 151 is formed. This process is performed by, for example, a method such as RIE.

Both side surfaces of the insulating layer 160 in the Y direction tilt at an angle at which lower portions become close to the semiconductor layer 120 and upper portions become far from the semiconductor layer 120. That is, a width of a lower surface of the insulating layer 160 in the Y direction is wider than a width of an upper surface of the insulating layer 160 in the Y direction.

Figure 19:
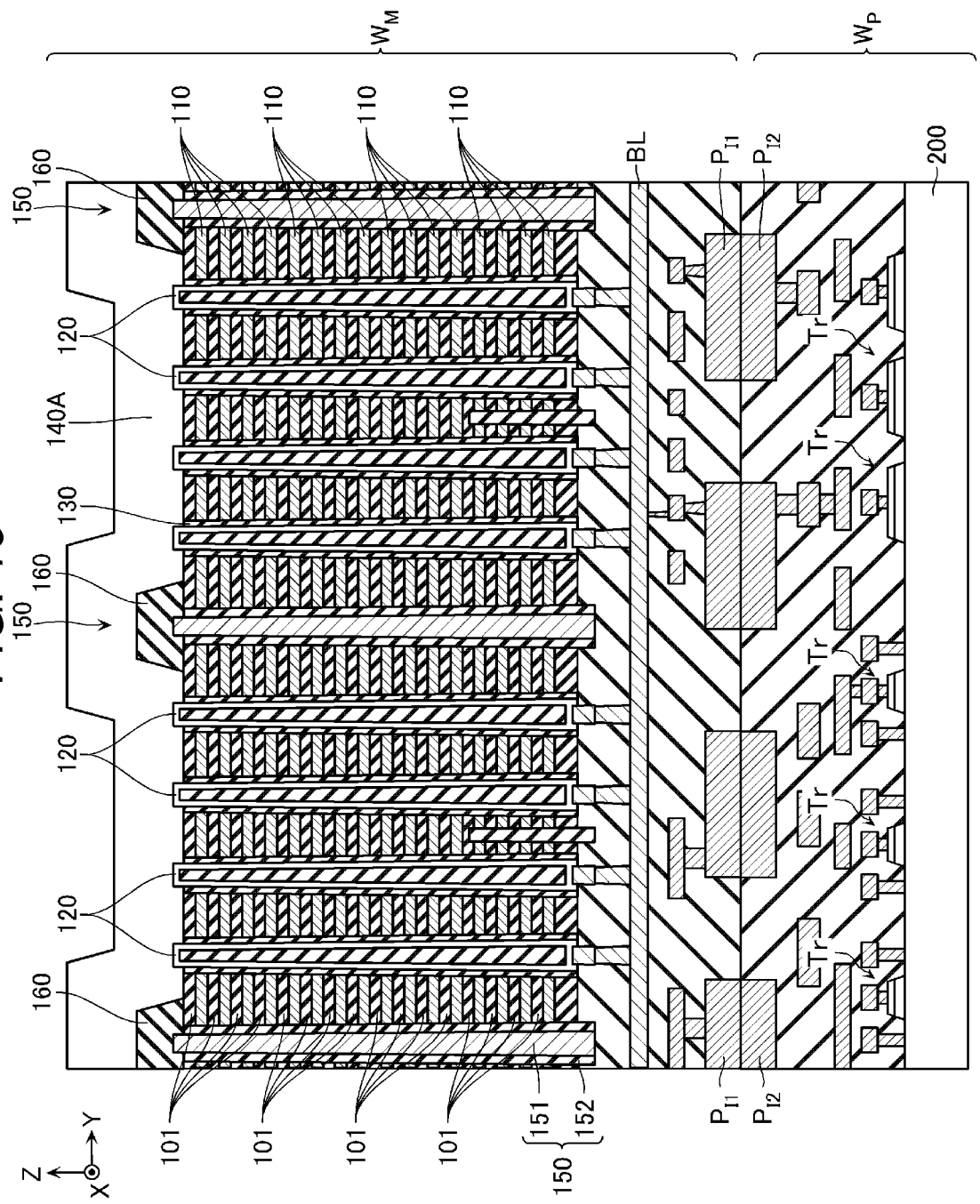

As shown in FIG. 19, an amorphous silicon layer 140A is formed covering an upper surface of the structure depicted in FIG. 18. This process is performed by, for example, a method such as CVD.

Figure 20:
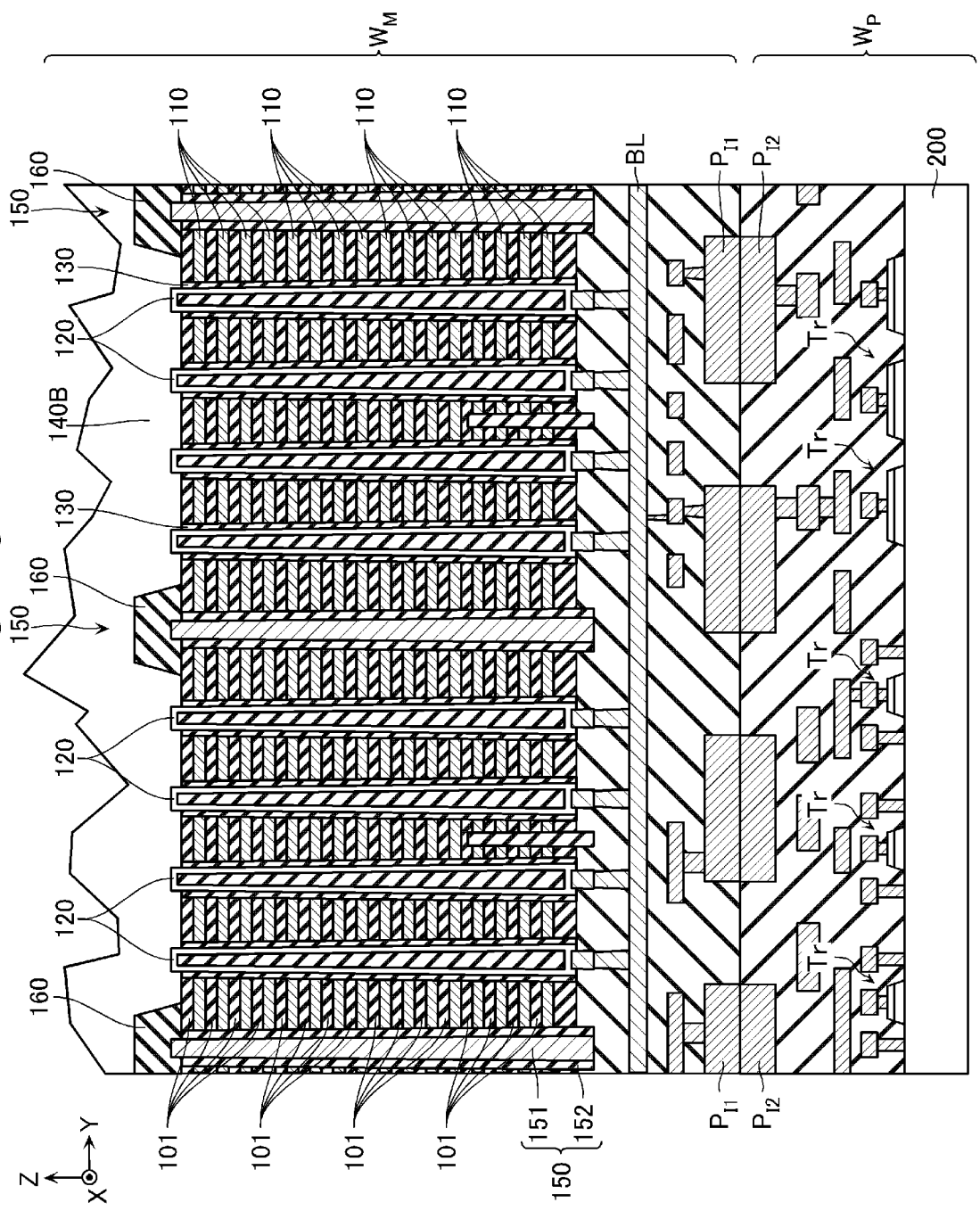

A polycrystalline silicon layer 140B is next formed by modifying a crystal structure of the amorphous silicon layer 140A, as shown in FIG. 20. This process is performed by, for example, a method such as laser annealing.

Figure 21:
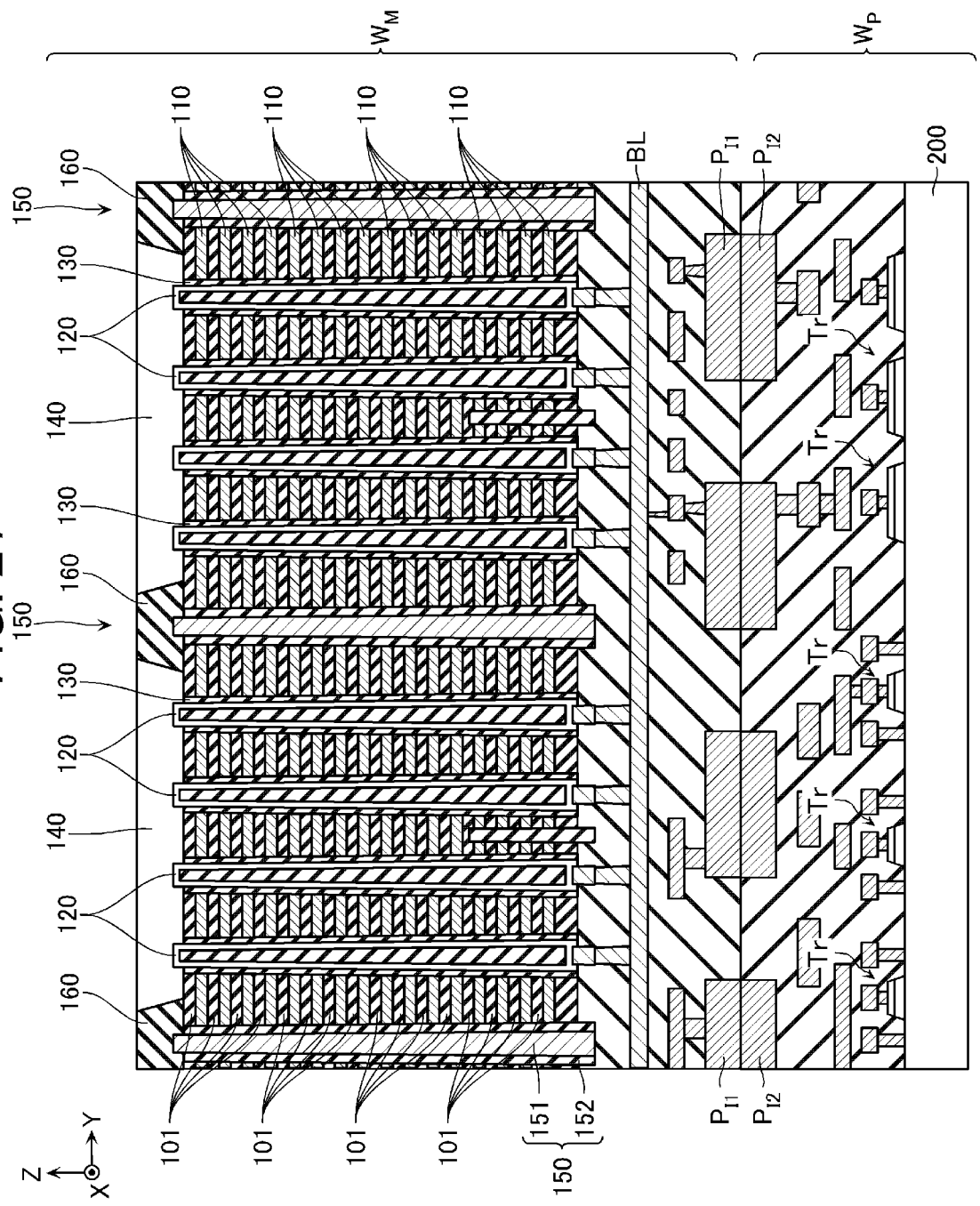

The semiconductor layer 140 is formed by performing a planarization process on the structure depicted in FIG. 20 and removing a part of the polycrystalline silicon layer 140B, as shown in FIG. 21. This process is performed by, for example, a method such as chemical mechanical polishing (CMP) using the insulating layers 160 as stoppers.

Figure 22:
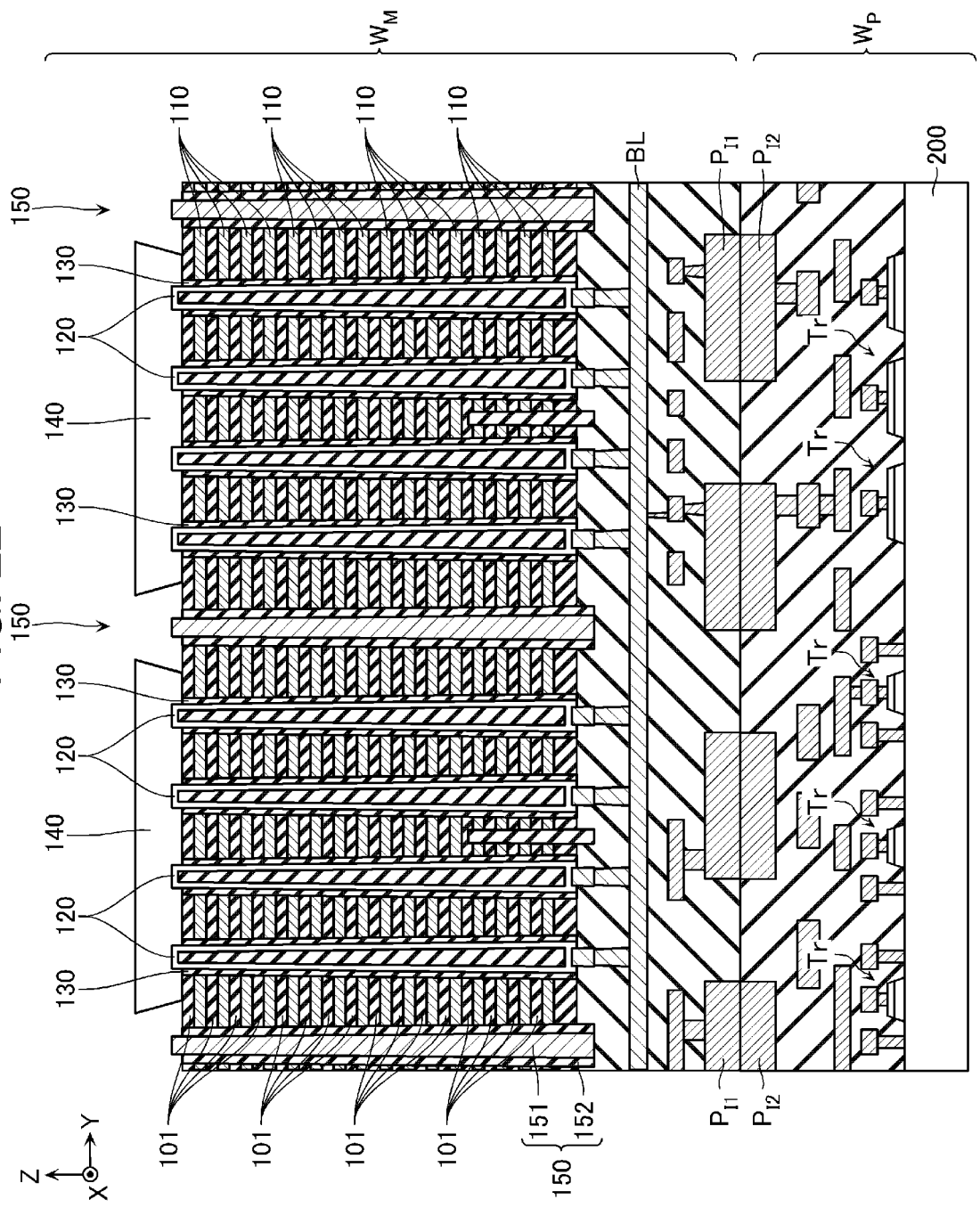

The upper ends of the conductive layers 151 are then exposed by removing the insulating layers 160, as shown in FIG. 22. This process is performed, for example, by wet etching or the like.

Next, a conductive layer 170 is formed on an upper surface of the structure depicted in FIG. 22. The formation of a conductive layer 170 is shown in FIG. 5. This process is performed by, for example, a method such as CVD.

Thereafter, a memory die MD is completed by forming the bonding pad electrodes P<sub>X</sub> and the like and then dicing the bonded wafers W<sub>M</sub> and W<sub>P</sub>.

Effects

In the read operation of the semiconductor storage device or the like, it is necessary to cause a current to flow from the bit line BL connected to the lower end of the semiconductor layer 120 to the source line connected to the upper end of the semiconductor layer 120. That is, the upper end of the semiconductor layer 120 needs to be electrically connected to a configuration such as a source line provided above the memory cell.

In order to connect the upper end of the semiconductor layer 120 to the configuration such as the source line, a front surface of the semiconductor substrate 100 or the like can be exposed by removing the gate insulating film 130 on a bottom surface of the through via hole 120A while leaving the gate insulating film 130 on the inner peripheral surface of the through via hole 120A at a timing after the formation of the gate insulating film 130 and before the formation of the semiconductor layer 120 in the process described with reference to FIG. 10. Such a method can be executed by, for example, a method such as RIE. Subsequently, the semiconductor layer 120 connected to the semiconductor substrate 100 can be formed inside the through via hole 120A.

However, with the increasing integration of the semiconductor storage devices, the number of conductive layer 110 arranged in the Z direction is increasing. Along with the increasing number, an aspect ratio of the through via hole 120A (described with reference to FIG. 9) is increasing. In such a case, it is becoming difficult to remove the gate insulating film 130 at the bottom surface of the through via hole 120A.

To address such issues, in the present embodiment, in order to connect the upper end of the semiconductor layer 120 to the configuration of the source line or the like, the upper end of the semiconductor layer 120 is exposed by removing the semiconductor substrate 100 or the like in the process described with reference to FIG. 16. In the subsequent processes, the semiconductor layer 140 or the like connected to the upper end of the semiconductor layer 120 is formed. According to such a method, it is not necessary to remove the gate insulating film 130 at the bottom surface of a through via hole 120A that has a large aspect ratio. Accordingly, a configuration for connecting the upper end of the semiconductor layer 120 and the source line can be manufactured relatively easily.

Here, in order to electrically connect the semiconductor layer 120 to the source line such as metal, it is necessary to form a semiconductor layer having a high impurity concentration at the upper end of the semiconductor layer 120. When such a semiconductor layer is formed by a method such as CVD, it is necessary to execute heat treatment or the like for modifying the crystal structure of the semiconductor layer. However, when the heat treatment or the like are performed on the wafer $W_M$ and the wafer $W_P$ after the wafers are bonded, there is a concern that diffusion of metal atoms occurs in the first bonding electrodes $P_{f1}$ and the second bonding electrodes $P_{f2}$, the bit line BL or an interconnection layer in the vicinity thereof, or an interconnection layer in the vicinity of the transistor Tr. Accordingly, there is a concern that the memory die MD does not operate suitably.

To address such issues, in the present embodiment, after the amorphous silicon layer 140A is formed in the process described with reference to FIG. 19, the crystal structure of the amorphous silicon layer 140A is modified by a method such as laser annealing in the process described with reference to FIG. 20. According to such a method, a temperature of an upper surface of the wafer $W_M$ can be locally raised. Accordingly, the crystal structure of the amorphous silicon layer 140A can be modified while preventing the diffusion of the metal atoms and the like.

However, as a result of intensive studies by the inventors, it was found that when the crystal structure of the amorphous silicon layer 140A is modified by a method such as laser annealing, roughness of an upper surface of the polycrystalline silicon layer 140B relatively increases, as shown in FIG. 20. In such a case, the subsequent processes may be affected.

When the crystal structure of the amorphous silicon layer 140A is modified by a method such as laser annealing, the annealing laser beam may reach the conductive layer 151. In such a case, heat may be transferred to the interconnection layers such as the first bonding electrodes $P_{f1}$ and second bonding electrodes $P_{f2}$ via the conductive layer 151, and diffusion of the metal atoms and the like may occur.

To address such issues, in the present embodiment, the insulating layers 160 covering the upper ends of the conductive layers 151 are formed on the upper surface of the wafer $W_M$ in the processes described with reference to FIGS. 17 and 18. In the process described with reference to FIG. 21, the upper surface of the polycrystalline silicon layer 140B is planarized (flattened) by executing CMP or the like using the insulating layers 160 as stoppers.

According to such a method, the upper surface of the polycrystalline silicon layer 140B can be suitably flattened. The diffusion of the metal atoms and the like can be more suitably prevented by blocking the laser beam from reaching the conductive layers 151 with the insulating layers 160. Accordingly, the semiconductor storage device according to the first embodiment can be manufactured relatively easily.

Second Embodiment

Figure 23:
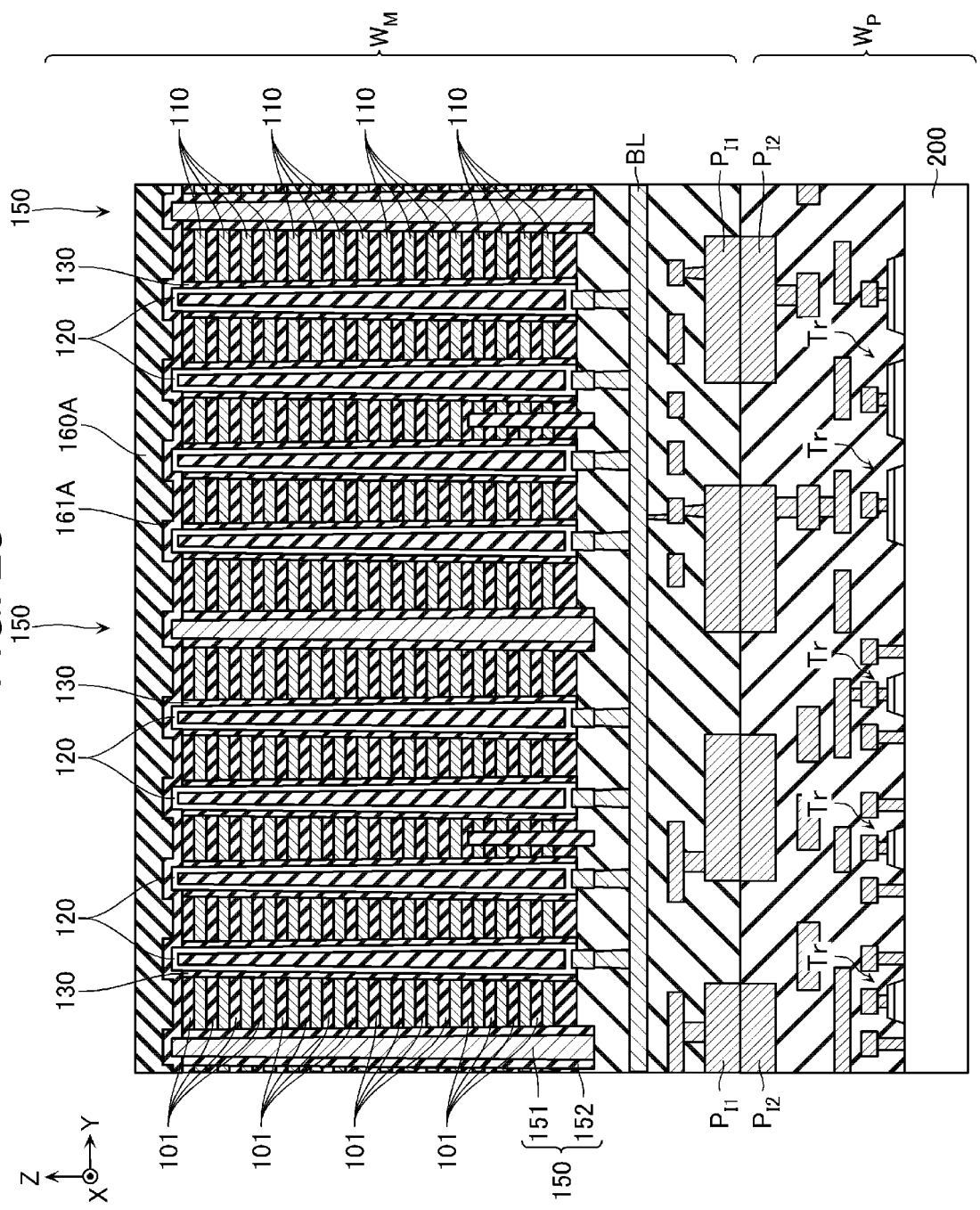
FIGS. 23-25 illustrate schematic cross-sectional views of structures to describe a method of manufacturing a semiconductor storage device according to a second embodiment.
Figure 24:
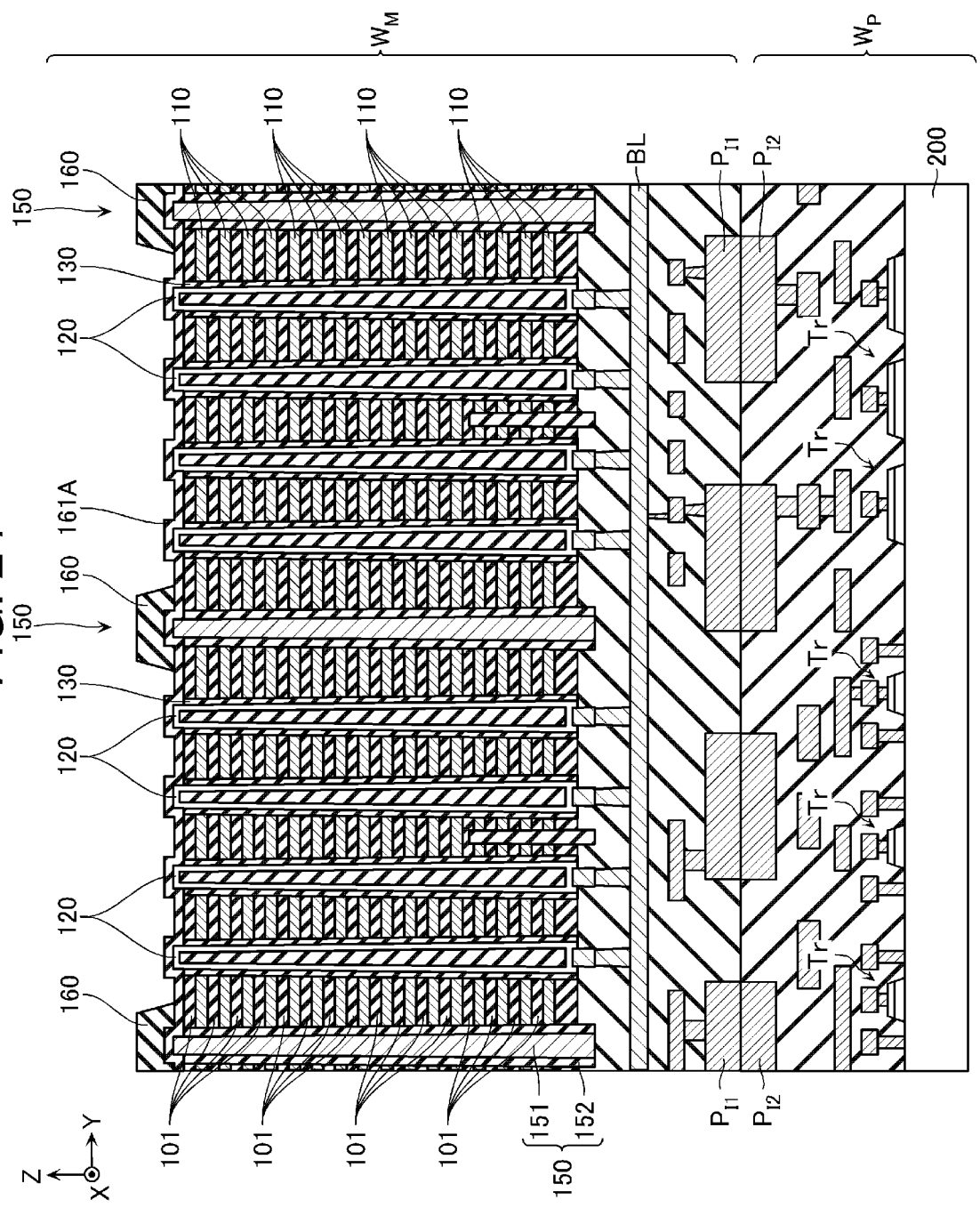
Figure 25:
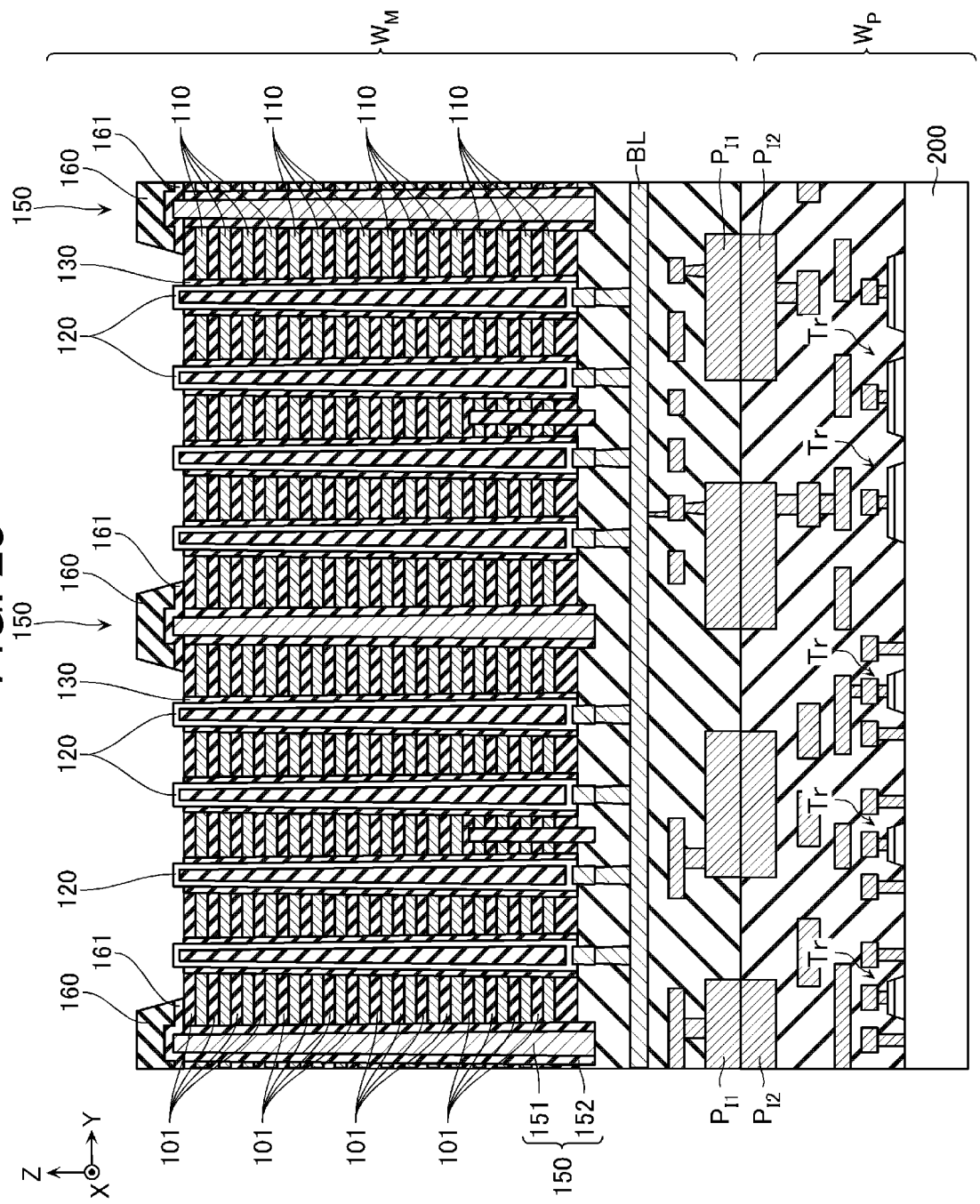

Next, a semiconductor storage device according to a second embodiment will be described with reference to FIGS. 23 to 25. FIGS. 23 to 25 are schematic cross-sectional views showing a method of manufacturing the semiconductor storage device according to the second embodiment, and show the configuration corresponding to FIG. 5.

The semiconductor storage device according to the second embodiment has a configuration similar to the semiconductor storage device according to the first embodiment. The semiconductor storage device according to the second embodiment is differs from the semiconductor storage device according to the first embodiment as a result of differences in manufacturing processes.

For example, as described with reference to FIGS. 17 and 18, in the manufacturing processes of the semiconductor storage device according to the first embodiment, the insulating layer 160A is formed on the upper surface of the structure shown in FIG. 16, and the insulating layers 160 covering the upper ends of the conductive layers 151 are formed by selectively removing a part of the insulating layer 160A by a method such as RIE.

On the other hand, in the manufacturing processes of the semiconductor storage device according to the second embodiment, an insulating layer 161A is formed on the upper surface of the structure shown in FIG. 16, and then the insulating layer 160A is formed over the insulating layer 161A, as shown in FIG. 23. The insulating layer 161A comprises, for example, silicon nitride ($Si_3N_4$) or the like. This process is performed by, for example, a method such as CVD.

The upper surface of the insulating layer 161A is exposed by removing the portions of the insulating layer 160A corresponding to the memory blocks BLK, as shown in FIG. 24. As a result, the plurality of insulating layers 160 covering the upper ends of the conductive layers 151 is formed. This process is performed by, for example, a method such as RIE.

Subsequently, the upper ends of the plurality of semiconductor layers 120 are exposed by removing the portions of the insulating layer 161A corresponding to the memory blocks BLK, as shown in FIG. 25. As a result, a plurality of insulating layers 161 covering the upper ends of the conductive layers 151 is formed. This process is performed by selectively removing a part of the insulating layer 161A by, for example, a method such as wet etching.

Third Embodiment

Next, a semiconductor storage device according to a third embodiment will be described with reference to FIG. 26.

Figure 26:
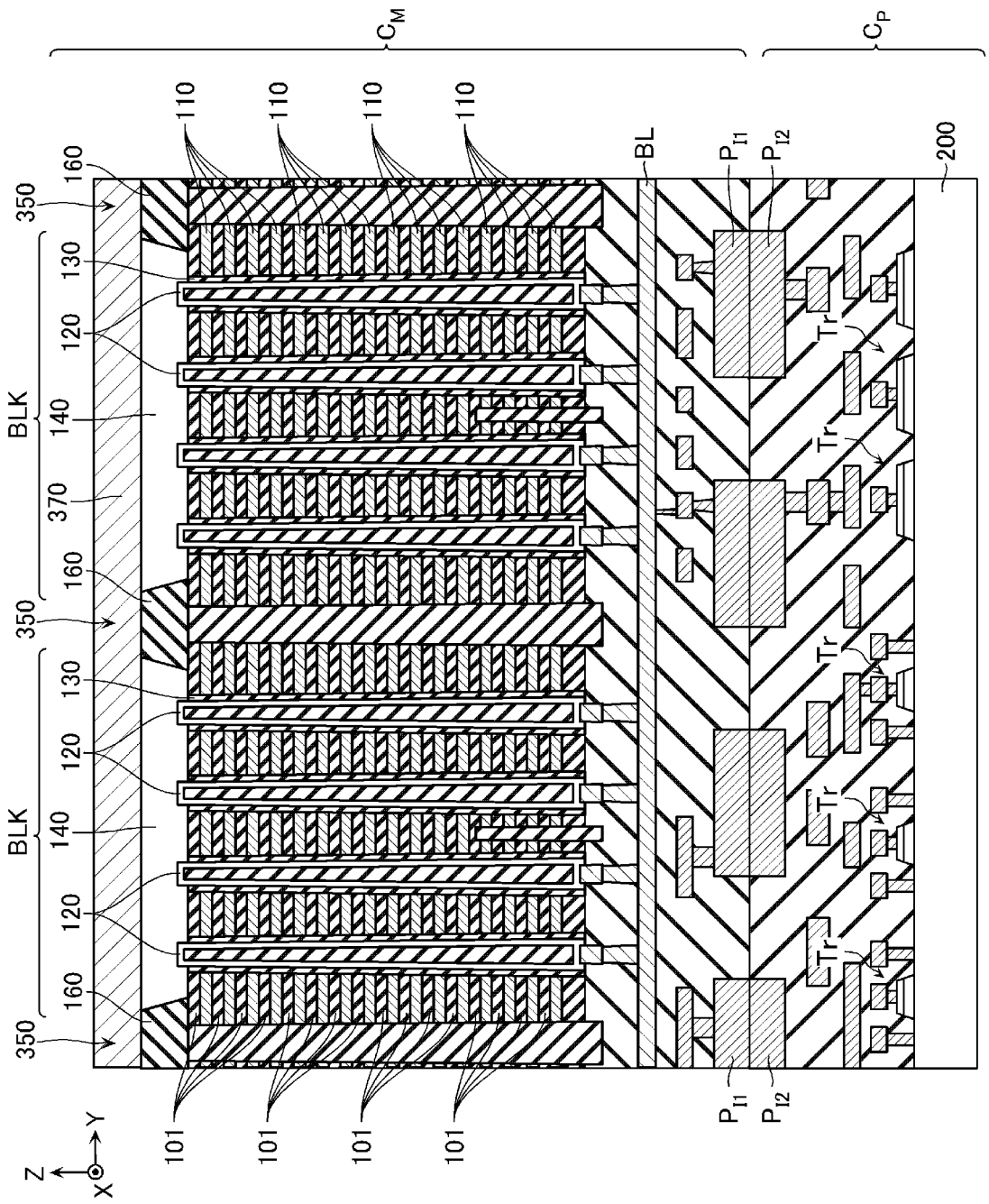
FIG. 26 illustrates a schematic cross-sectional view of a configuration of a part of a semiconductor storage device according to a third embodiment.

FIG. 26 illustrates a schematic cross-sectional view of a configuration of the semiconductor storage device according to the third embodiment.

The semiconductor storage device according to the third embodiment has a configuration similar to the configuration of the semiconductor storage device according to the first embodiment. However, the semiconductor storage device according to the third embodiment includes inter-block structures 350, the insulating layers 160, and a conductive layer 370 instead of the inter-block structures 150 and the conductive layer 170.

The inter-block structure 350 is an insulating layer such as silicon oxide ($SiO_2$) extending in the Z direction and the X direction.

The conductive layer 370 may comprise, for example, a stacked film of a barrier conductive film, such as titanium nitride (TiN), and a metal film, such as copper (Cu) or aluminum (Al), and the like. The conductive layer 370 functions, for example, as a part of the source line.

The conductive layer 370 covers all the upper surfaces of the plurality of semiconductor layers 140 and the plurality of insulating layers 160 arranged in the Y direction. The conductive layer 370 is joined to the upper surface of the semiconductor layer 140 and is in contact with the upper surfaces of the insulating layers 160.

An upper surface and a lower surface of the conductive layer 370 are formed so as to be substantially flat unlike the conductive layer 170.

A method of manufacturing the semiconductor storage device according to the third embodiment is similar to the method of manufacturing the semiconductor storage device according to the first embodiment. However, in the third embodiment, in a process corresponding to the process described with reference to FIG. 13, the inter-block structure 350 is formed in the groove 150A. This process is performed by, for example, a method such as CVD or RIE. The process described with reference to FIG. 22 is not executed for the manufacturing of the semiconductor storage device according to the third embodiment.

Figure 27:
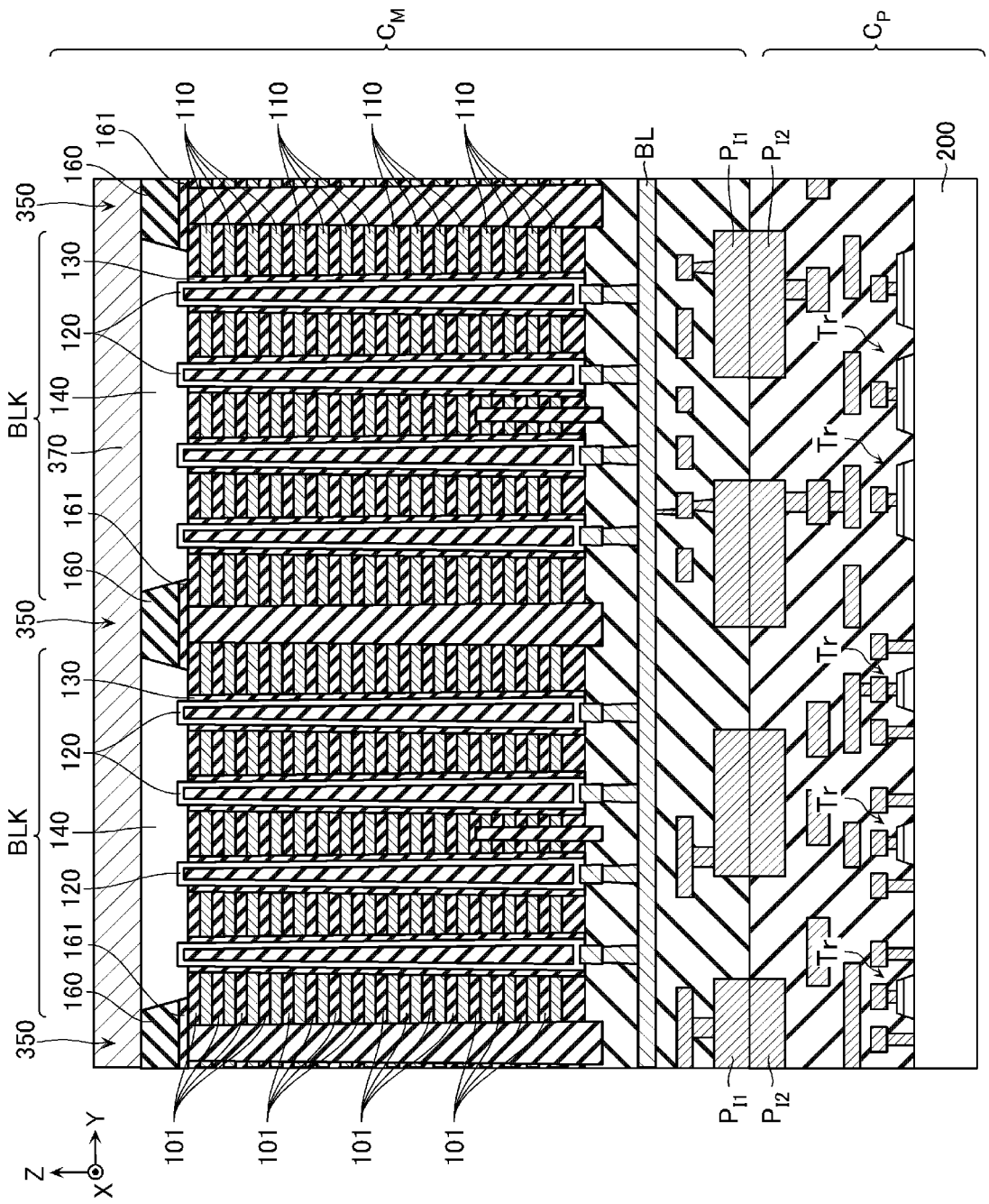
FIG. 27 illustrates a schematic cross-sectional view of a configuration of a part of another configuration example of the semiconductor storage device according to the third embodiment.

In the manufacturing processes of the semiconductor storage device according to the third embodiment, the processes described with reference to FIGS. 23 to 25 for the second embodiment may be executed instead of executing the processes described with reference to FIGS. 17 and 18 for the first embodiment. In such a case, the insulating layer 161 would be provided between the inter-block structure 350 and the insulating layer 160 of the semiconductor storage device according to the third embodiment, as shown in FIG. 27.

Fourth Embodiment

Figure 28:
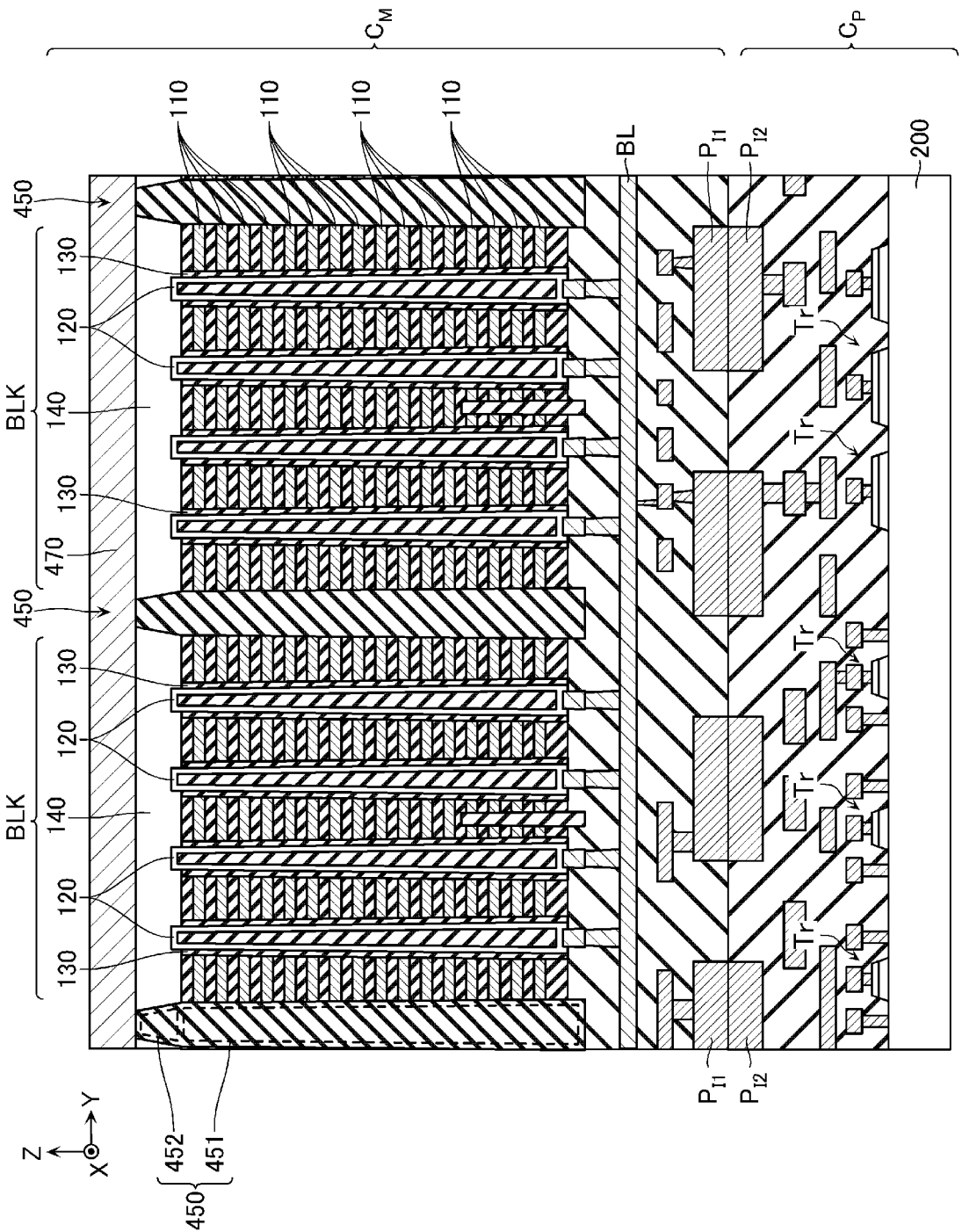
FIG. 28 illustrates a schematic cross-sectional view of a configuration of a part of a semiconductor storage device according to a fourth embodiment.

Next, a semiconductor storage device according to a fourth embodiment will be described with reference to FIG. 28. FIG. 28 illustrates a schematic cross-sectional view of a configuration of the semiconductor storage device according to the fourth embodiment.

The semiconductor storage device according to the fourth embodiment has a configuration similar to the configuration of the semiconductor storage device according to the first embodiment. However, the semiconductor storage device according to the fourth embodiment includes inter-block structures 450 and a conductive layer 470 instead of the inter-block structures 150 and the conductive layer 170.

The inter-block structure 450 is an insulating layer, such as silicon oxide ($SiO_2$), extending in the Z direction and the X direction. The inter-block structure 450 includes a first portion 451 provided at a height location corresponding to the plurality of conductive layers 110 and the insulating layers 101, and a second portion 452 provided at a height location corresponding to the semiconductor layer 140.

The conductive layer 470 has a configuration similar to the configuration of the conductive layer 370 according to the third embodiment. However, a part of a lower surface of the conductive layer 470 is in contact with upper surfaces of the inter-block structures 450 instead of the upper surfaces of the insulating layers 160.

Figure 29:
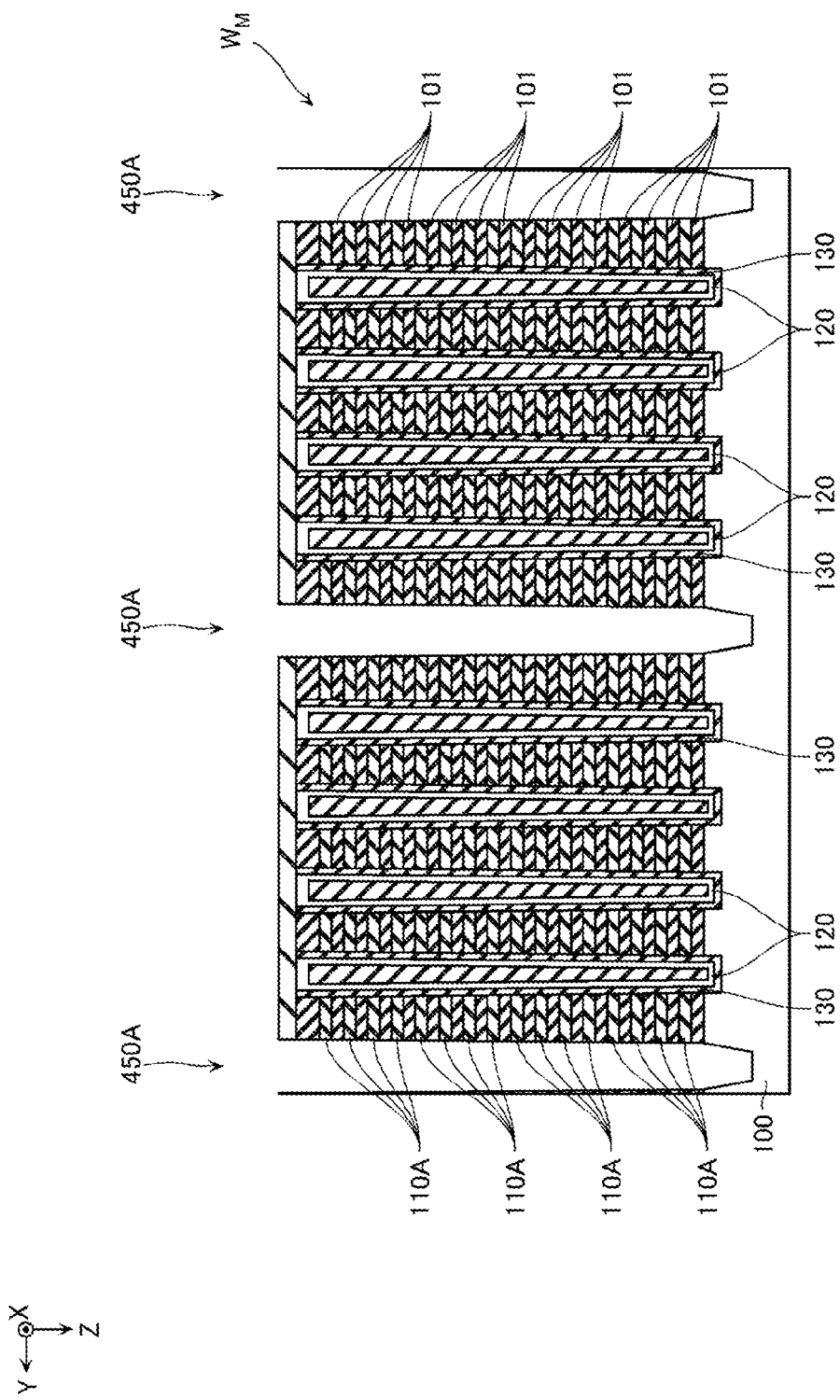
FIGS. 29-34 illustrate schematic cross-sectional views of structures to describe a method of manufacturing the semiconductor storage device according to the fourth embodiment.

A method of manufacturing the semiconductor storage device according to the fourth embodiment is basically similar to the method of manufacturing the semiconductor storage device according to the first embodiment. However, in the fourth embodiment, in a process corresponding to the process described with reference to FIG. 11, grooves 450A are formed, as shown in FIG. 29. The groove 450A is formed in a similar manner to the groove 150A. However, a height location of a bottom portion of the groove 450A is adjusted to be at a location corresponding to a height location of an upper end of the inter-block structure 450. A depth of the groove 450A in the Z direction is deeper than a depth of the through via hole 120A in the Z direction.

Figure 30:
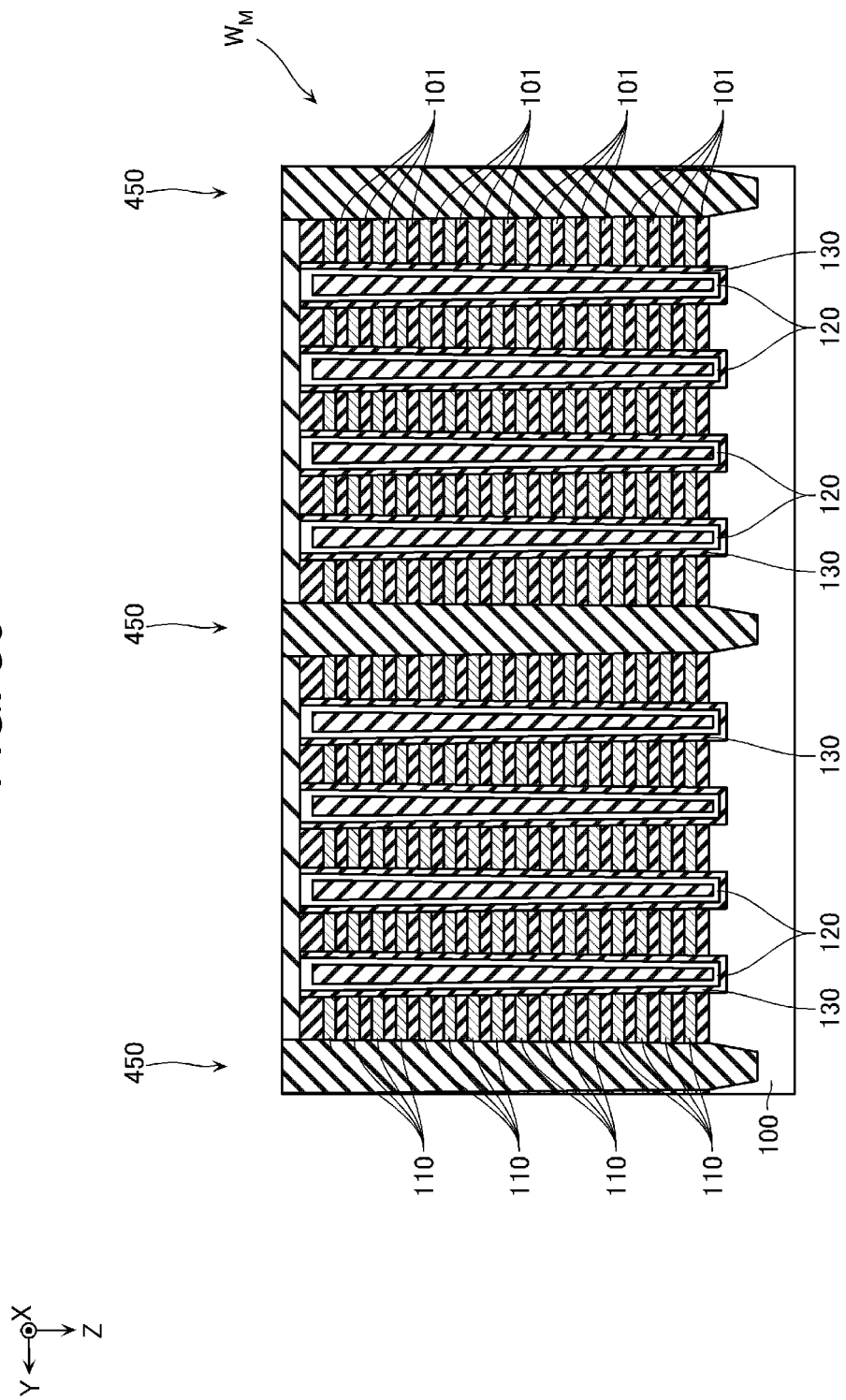

In a process corresponding to the process described with reference to FIG. 13, the inter-block structure 450 is formed in the groove 450A, as shown in FIG. 30. This process is performed by, for example, a method such as CVD or RIE.

Figure 31:
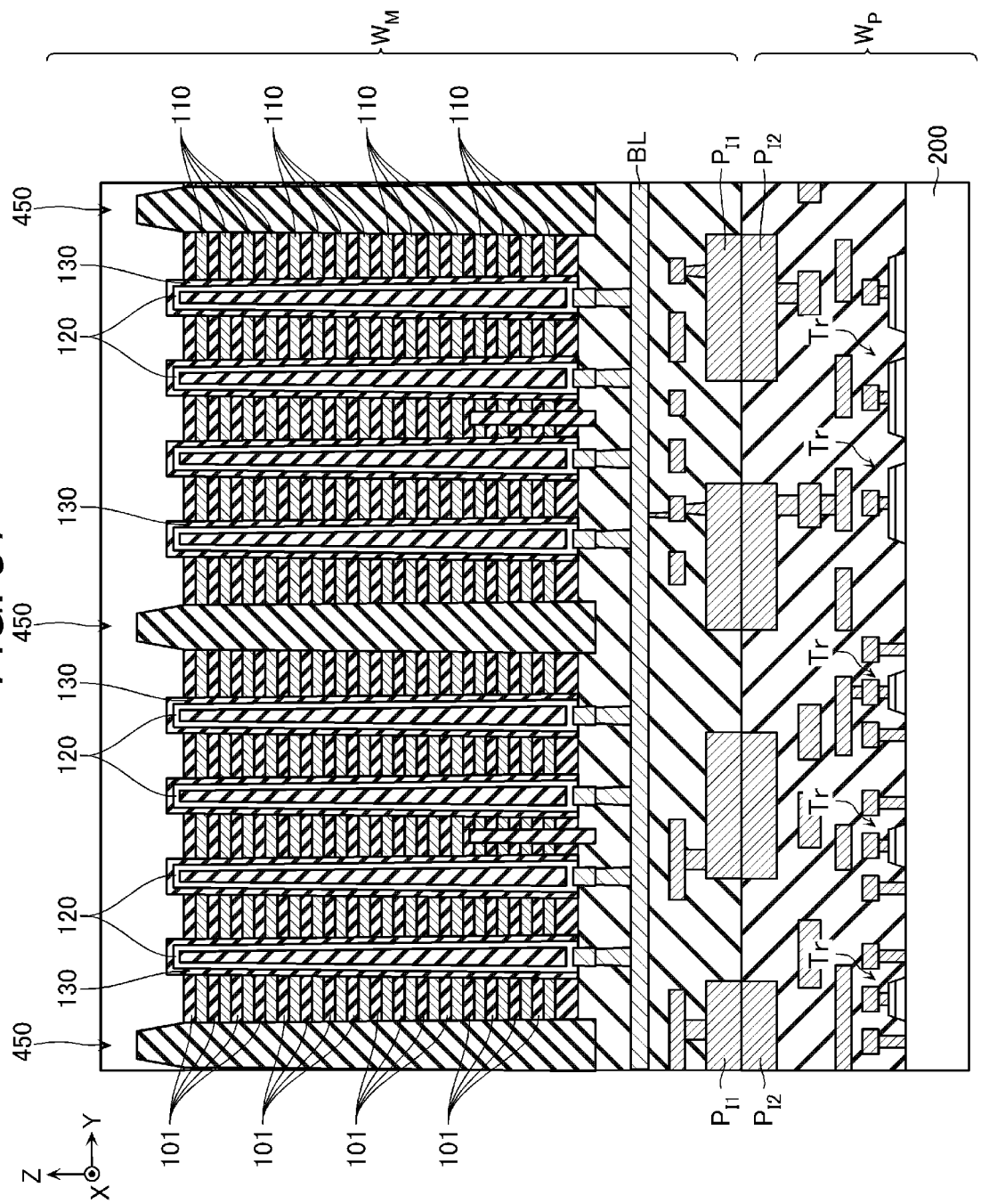
Figure 32:
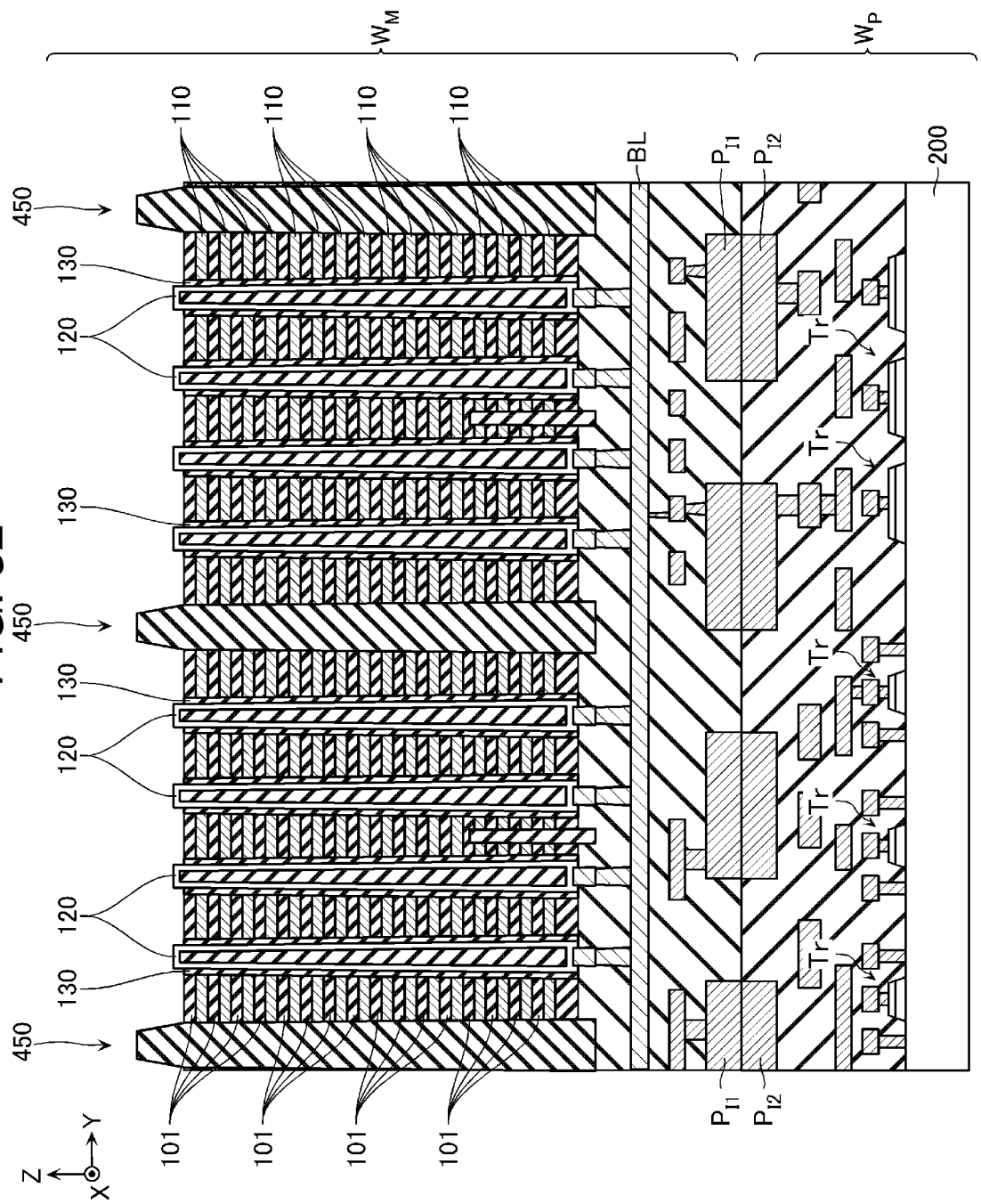

As shown in FIGS. 31 and 32, the processes similar to those described with reference to FIGS. 14 to 16 are executed.

The processes described with reference to FIGS. 17 and 18 are not executed for the fourth embodiment.

Figure 33:
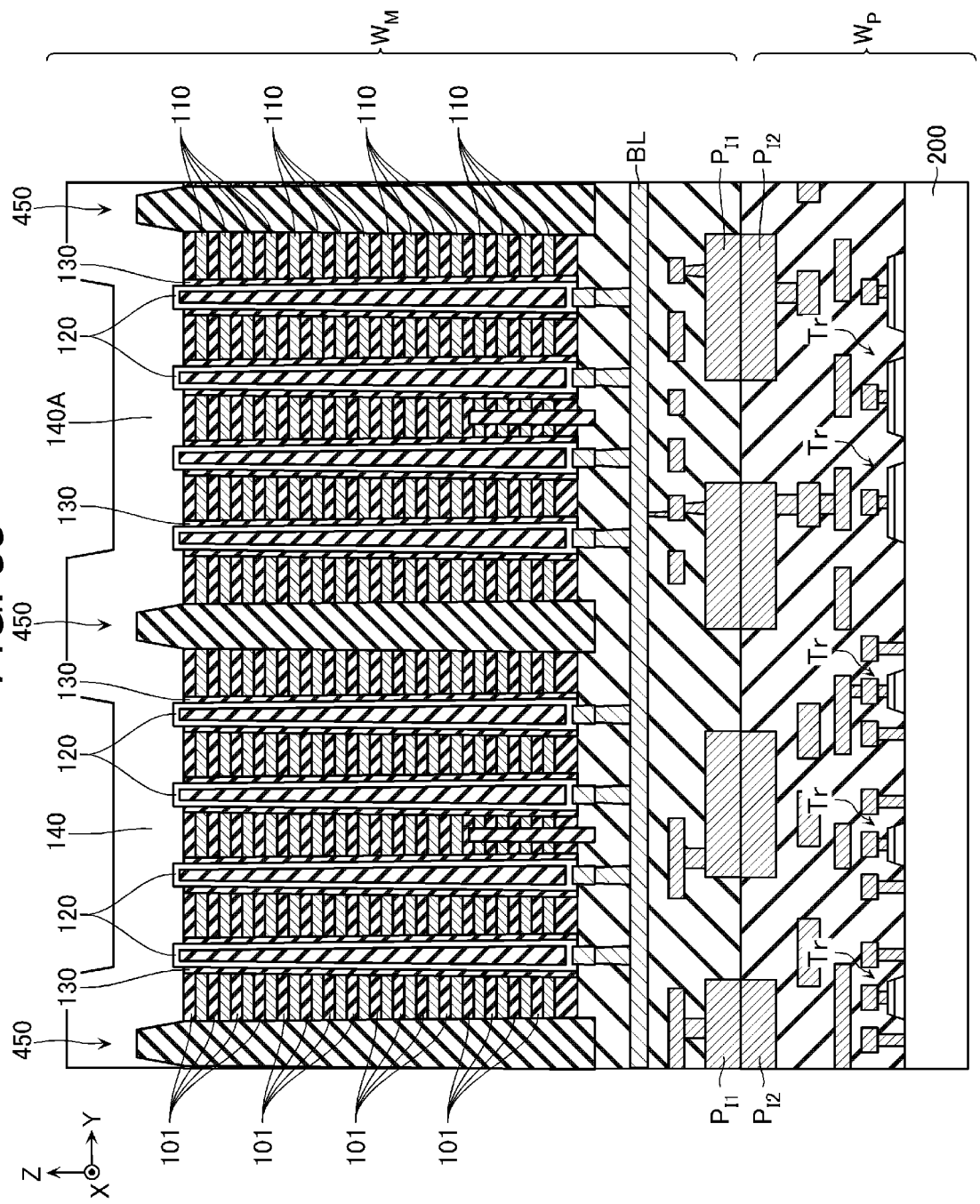
Figure 34:
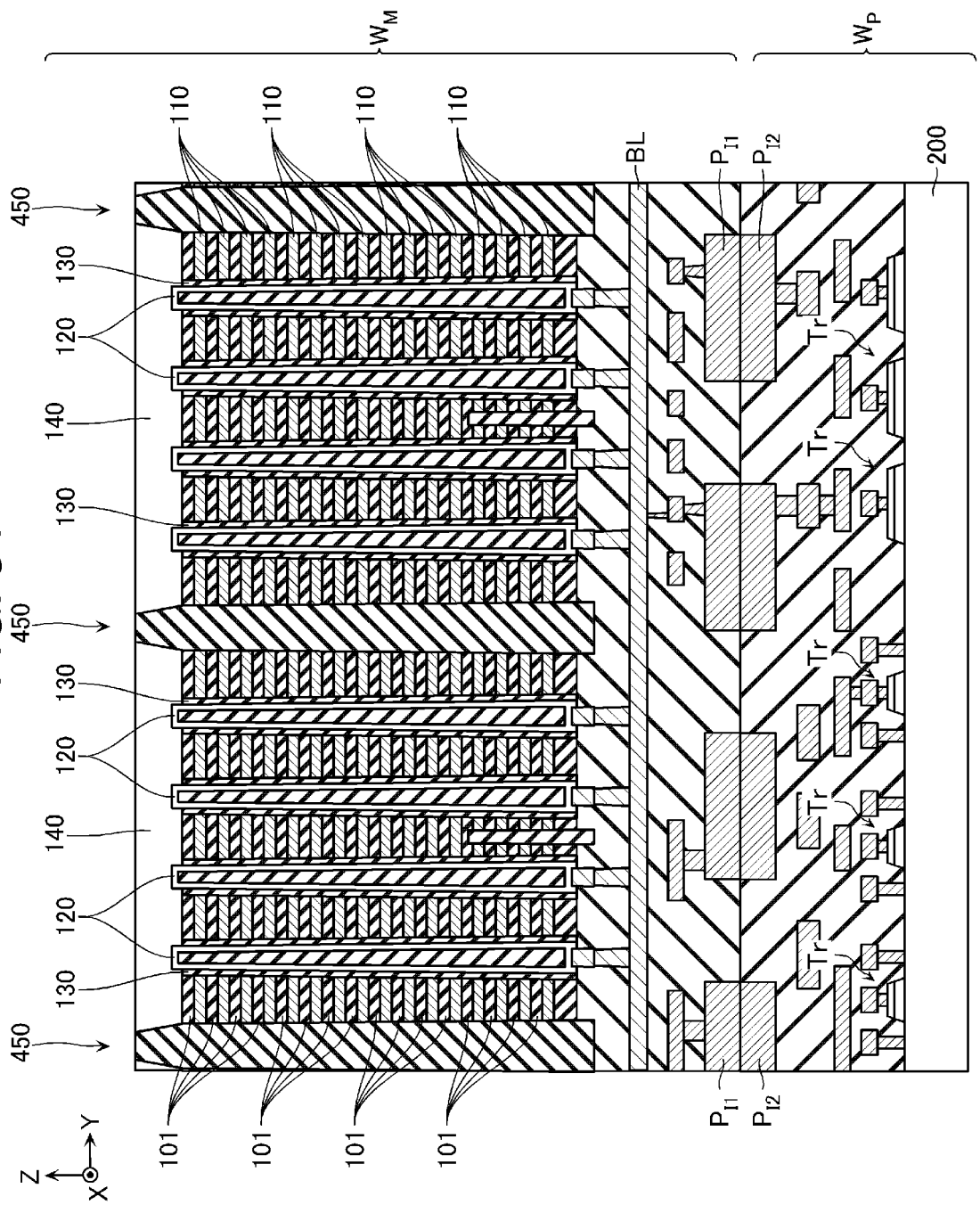

As shown in FIGS. 33 and 34, the processes similar to those described with reference to FIGS. 19 to 21 are executed. However, in a process corresponding to the process described with reference to FIG. 21, the inter-block structures 450 are used as stoppers for CMP or the like as shown in FIG. 34 instead of the insulating layers 160.

Fifth Embodiment

Figure 35:
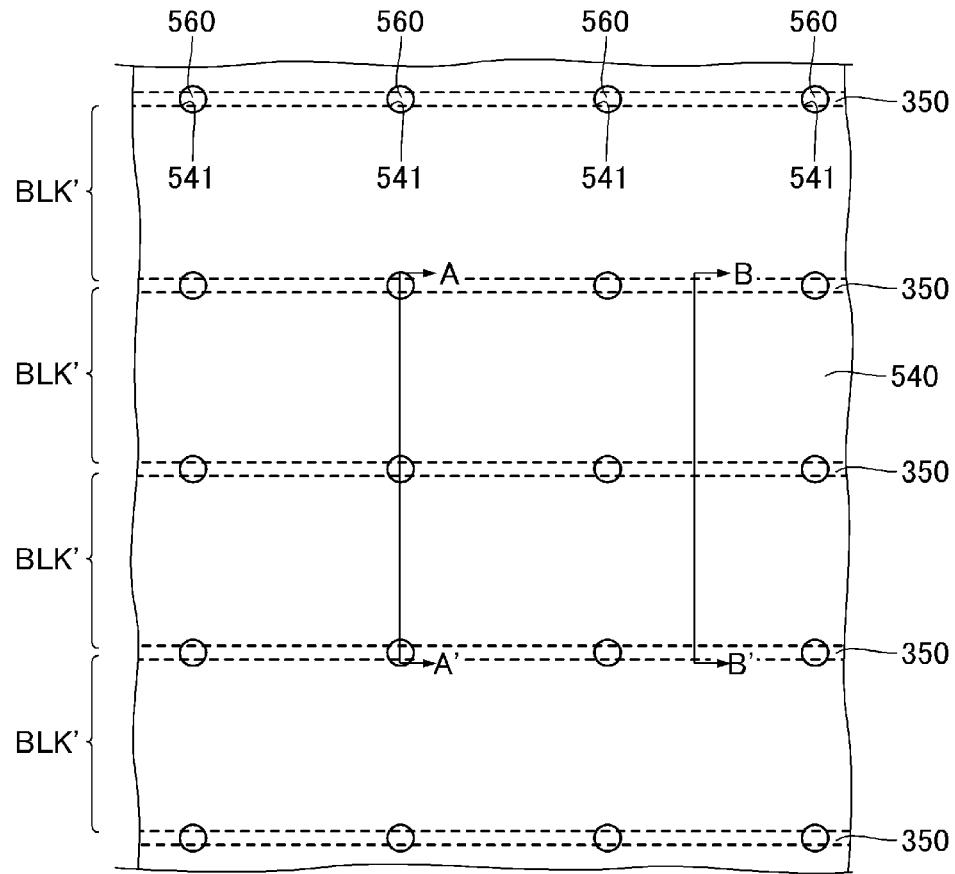
FIG. 35 illustrates a schematic plan view of a configuration of a part of a semiconductor storage device according to a fifth embodiment.
Figure 36:
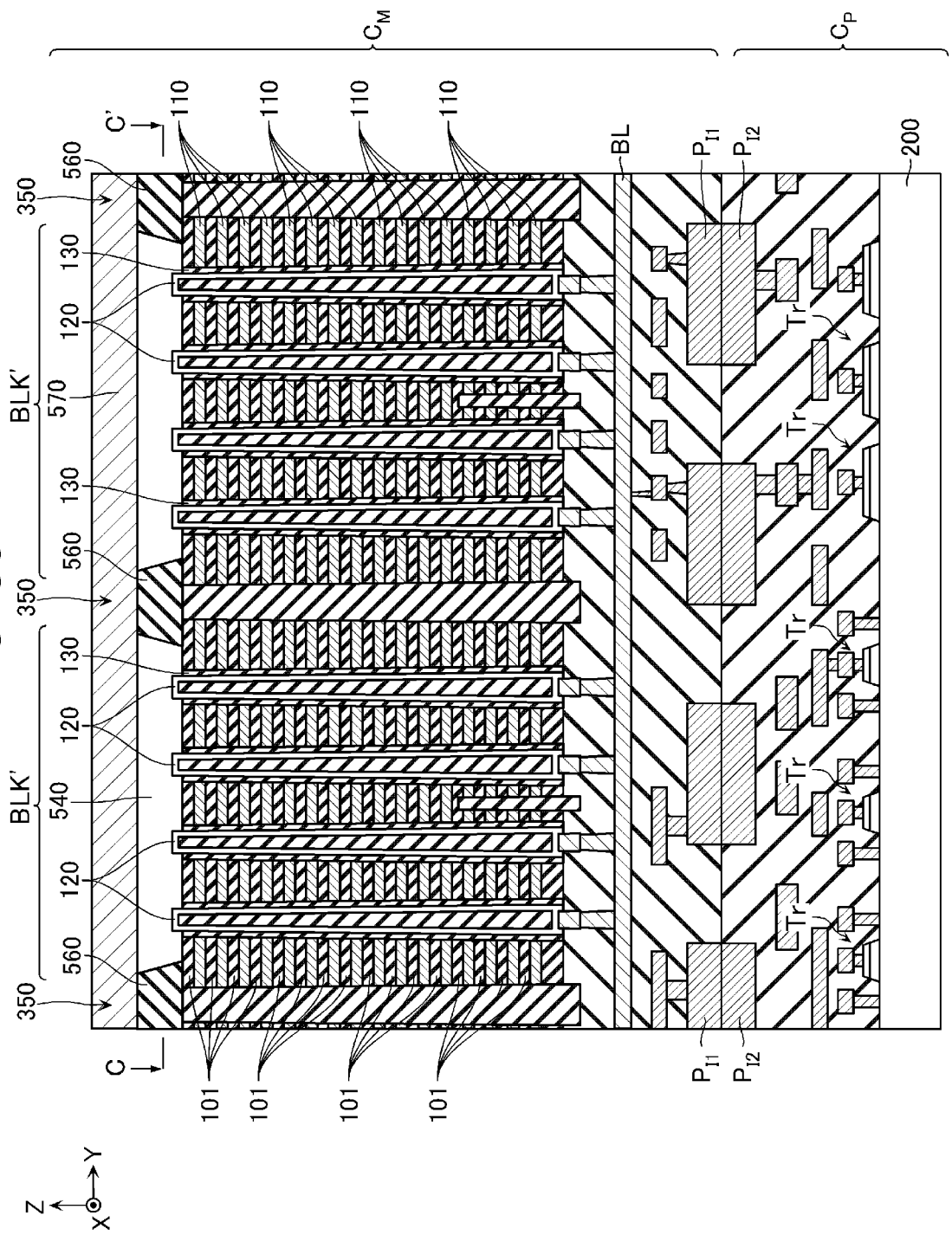
FIG. 36 illustrates a schematic cross-sectional view of a configuration of a part of the semiconductor storage device according to the fifth embodiment.
Figure 37:
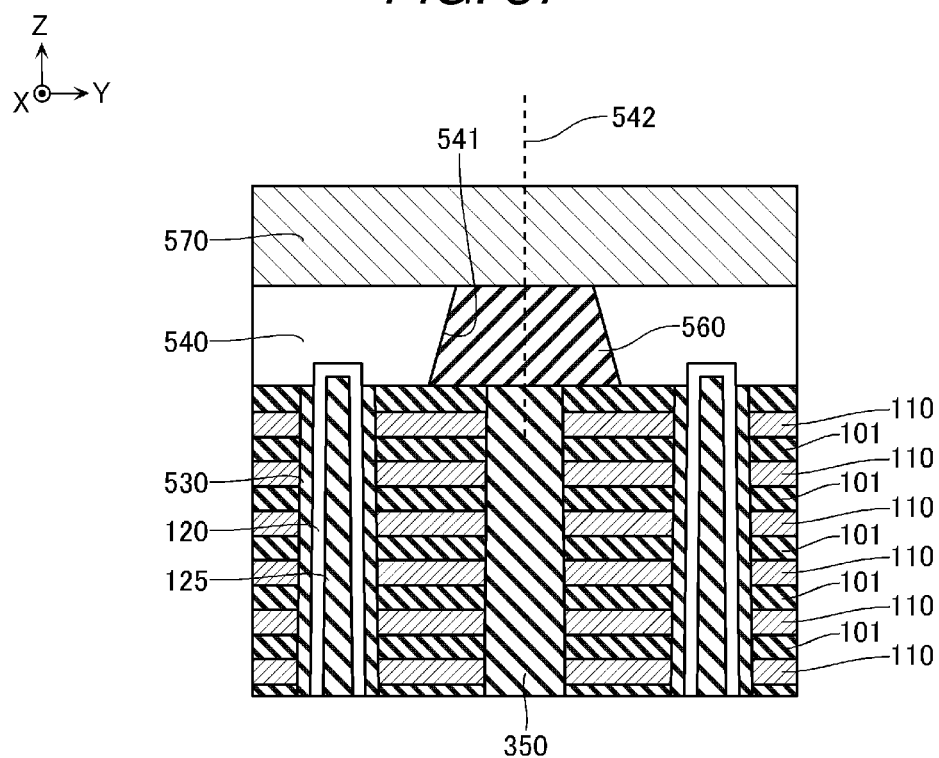
FIG. 37 illustrates a schematic enlarged cross-sectional view of a configuration of a part of FIG. 36.
Figure 38:
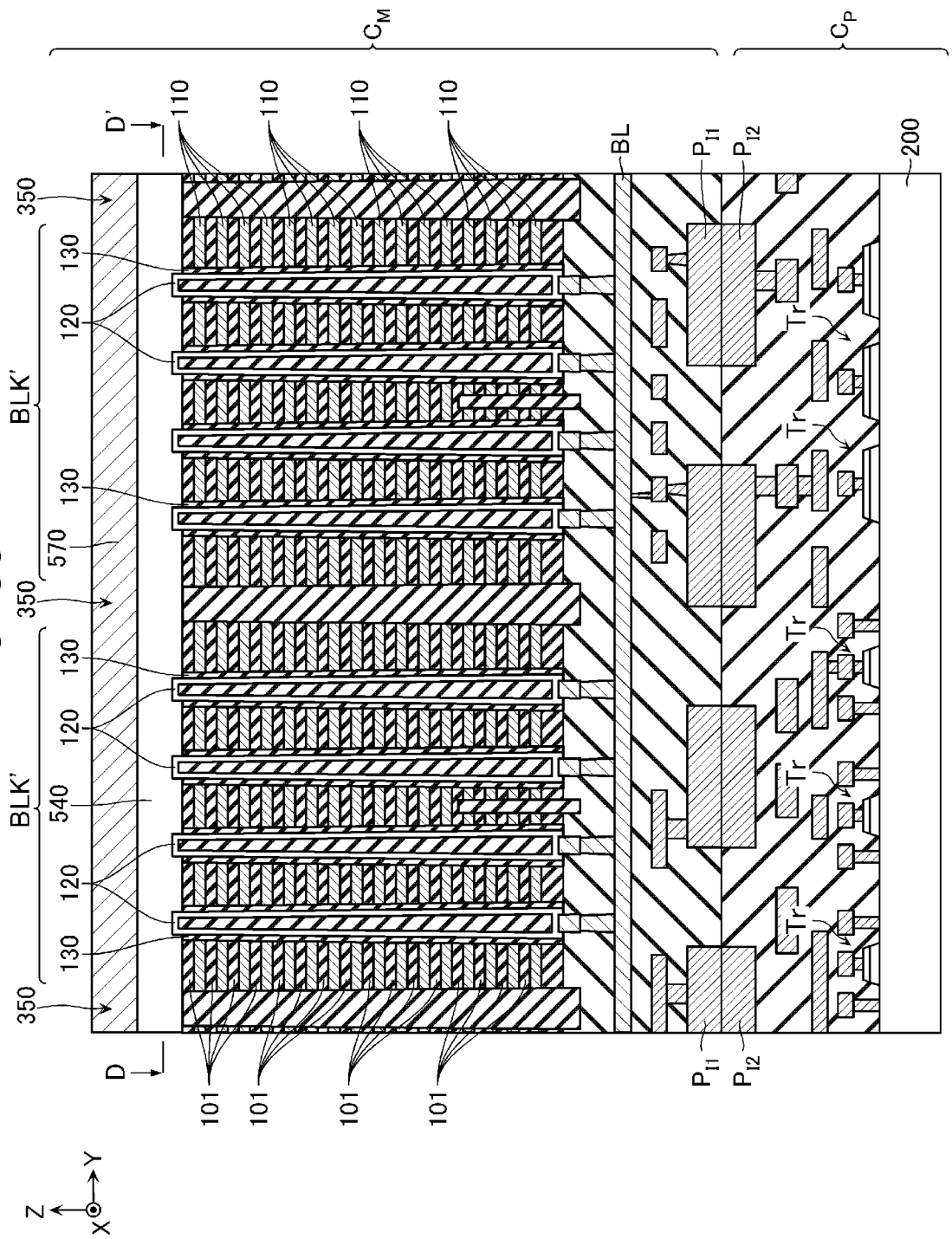
FIG. 38 illustrates a schematic cross-sectional view of a configuration of a part of the semiconductor storage device according to the fifth embodiment.

Next, a semiconductor storage device according to a fifth embodiment will be described with reference to FIGS. 35 to 38. FIG. 35 illustrates a schematic plan view of a configuration of the semiconductor storage device according to the fifth embodiment. FIG. 36 illustrates a schematic cross-sectional view of a configuration of a part of the semiconductor storage device. FIG. 37 illustrates a schematic enlarged cross-sectional view of a part of the structure shown in FIG. 36. FIG. 38 illustrates a schematic cross-sectional view of a configuration of a part of the semiconductor storage device. FIG. 35 corresponds to a cross section of the structure shown in FIG. 36 cut along a line C-C' and viewed along a direction of an arrow. FIG. 35 corresponds to a cross section of the structure shown in FIG. 38 cut along a line D-D' and viewed along a direction of an arrow. FIG. 36 corresponds to a cross section of the structure shown in FIG. 35 cut along a line A-A' and viewed along a direction of an arrow. FIG. 38 corresponds to a cross section of the structure shown in FIG. 35 cut along a line B-B' and viewed along a direction of an arrow.

The semiconductor storage device according to the fifth embodiment has a configuration similar to the configuration of the semiconductor storage device according to the third embodiment. However, the memory cell array region $R_{MCA}$ of the semiconductor storage device according to the fifth embodiment includes a plurality of memory blocks BLK' arranged in the Y direction, the plurality of inter-block structures 350 provided between the plurality of memory blocks BLK', a semiconductor layer 540 provided on upper surfaces of the plurality of memory blocks BLK' and the plurality of inter-block structures 350, an insulating layer 560 provided on upper ends of the inter-block structures 350, and a conductive layer 570 provided on upper surfaces of the semiconductor layer 540 and the insulating layer 560.

The memory block BLK' has a configuration similar to the configuration of the memory block BLK according to the third embodiment. However, the memory block BLK' does not include the semiconductor layer 140.

The semiconductor layer 540 covers all the upper surfaces of the plurality of memory blocks BLK' arranged in the Y direction, and is connected to the upper ends of all the semiconductor layers 120 in the plurality of memory blocks BLK'. As shown in FIG. 35, a plurality of through via holes 541 arranged at predetermined intervals in the X direction is provided at locations of the semiconductor layer 540 corresponding to the inter-block structures 350.

In the illustrated example, the through via holes 541 are provided in the cross section (FIG. 36) corresponding to the line A-A' of FIG. 35. In such a cross section, the upper end of the inter-block structure 350 faces a lower surface of the conductive layer 570 via the insulating layer 560 without the semiconductor layer 540 interposed therebetween. On the other hand, the through via hole 541 is not provided in the cross section (FIG. 38) corresponding to the line B-B' of FIG. 35. In such a cross section, the upper ends of the inter-block structures 350 face the lower surface of the conductive layer 570 via the semiconductor layer 540.

As shown in FIG. 37, an inner peripheral surface of the through via hole 541 tilts at an angle at which a lower portion becomes far from a central axis 542 of the through via hole 541 and an upper portion becomes close to the central axis 542 of the through via hole 541.

The insulating layer 560 comprises, for example, silicon oxide ($SiO_2$) or the like. As shown in FIG. 35, the insulating layers 560 are arranged at predetermined intervals in the X direction along the upper ends of the inter-block structures 350. Each of the insulating layers 560 is provided inside the through via hole 541 provided in the semiconductor layer 540.

As shown in FIG. 37, an outer peripheral surface of the insulating layer 560 tilts at an angle at which a lower portion becomes far from the central axis 542 of the through via hole 541 and an upper portion becomes close to the central axis 542 of the through via hole 541. That is, an outer diameter at a lower surface of the insulating layer 560 is larger than an outer diameter at the upper surface of the insulating layer 560.

The conductive layer 570 has a configuration similar to the configuration of the conductive layer 370. The conductive layer 570 covers all the upper surfaces of the semiconductor layers 540 and the insulating layers 560. The conductive layer 570 is joined to the upper surface of the semiconductor layer 540 and is in contact with the upper surface of the insulating layer 560.

A method of manufacturing the semiconductor storage device according to the fifth embodiment is similar to the method of manufacturing the semiconductor storage device according to the third embodiment. However, in the fifth embodiment, in a process corresponding to the process described with reference to FIG. 18, parts of the upper ends of the plurality of semiconductor layers 120 and the upper ends of the inter-block structures 350 are exposed by removing parts of the portion of the insulating layer 160A corresponding to the memory block BLK and the portion of the insulating layer 160A corresponding to the inter-block structure 350. As a result, the plurality of insulating layers 560 arranged in the X direction along the upper ends of the inter-block structures 350 is formed. This process is performed by, for example, a method such as RIE.

In the manufacturing processes of the semiconductor storage device according to the fifth embodiment, the process described with reference to FIG. 23 for the second embodiment may be executed instead of executing the process described with reference to FIG. 17 for the first embodiment. After the process described with reference to FIG. 23, the process corresponding to the process described with reference to FIG. 18 may be executed. After this process, a process similar to the process described with reference to FIG. 25 may be executed.

In such a case, the insulating layer 161 is provided between the inter-block structure 350 and the insulating layer 560 of the semiconductor storage device according to the fifth embodiment.

Others

Figure 39:
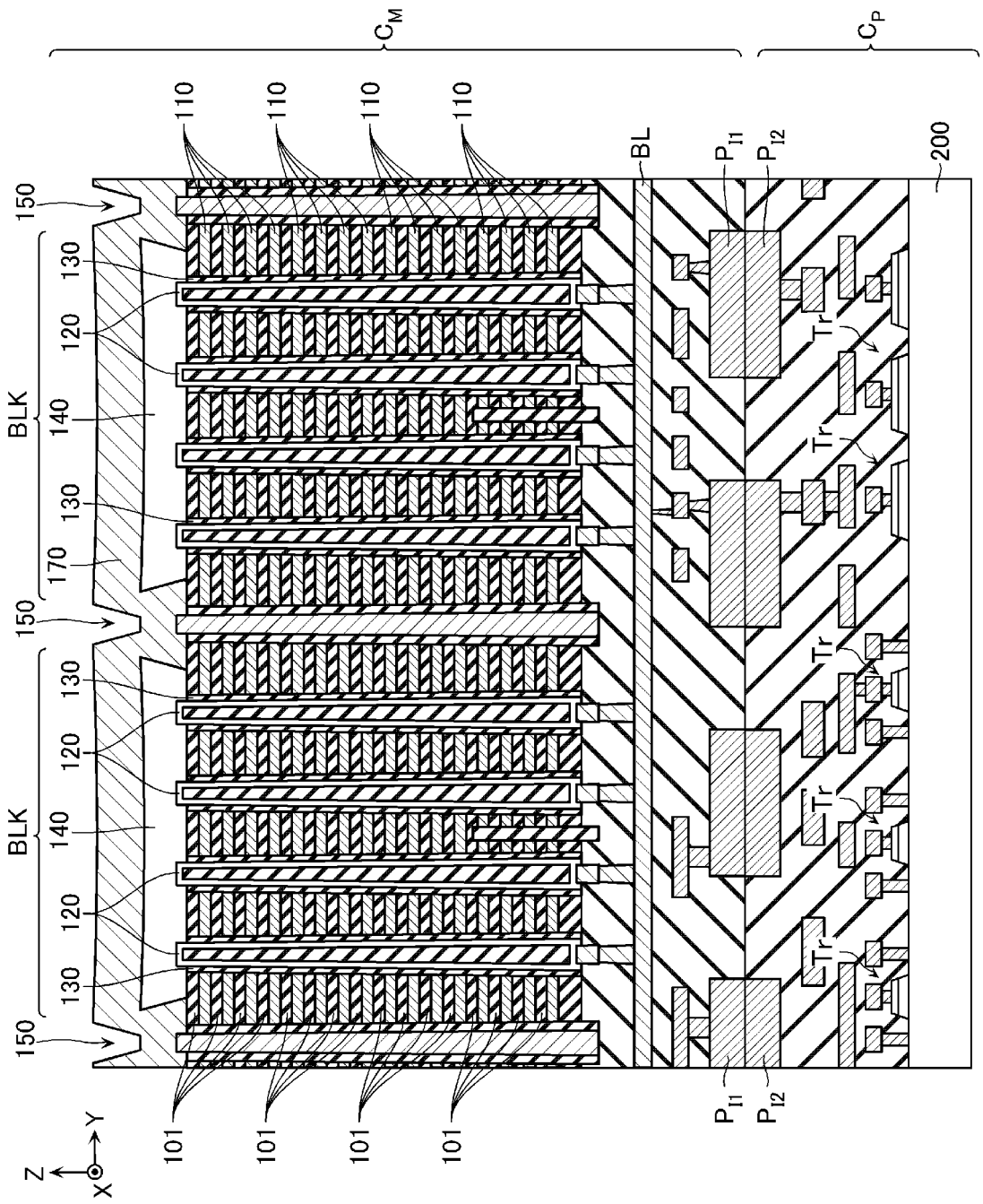
FIG. 39 illustrates a schematic cross-sectional view of a configuration of a part of another configuration example of the semiconductor storage device according to the first embodiment.

In the first to fourth embodiments, a planarization method such as CMP using the insulating layers 160 or the inter-block structures 450 as stoppers is executed in a process described with reference to FIG. 21 or a process similar to this process. As a result of the planarization process, the upper surface of the semiconductor layer 140 may be formed in a concave surface (dished) shape in that portions close to Y direction ends are higher than the central portions (portion away from the Y-direction ends), for example, as shown in FIG. 39. The upper surface and the lower surface of the portion 171 of the conductive layer 170, the corresponding portion of the conductive layer 370, or the corresponding portion of the conductive layer 470 may also be formed in a corresponding dished surface shape.

Similarly, in the fifth embodiment, in a process corresponding to the process described with reference to FIG. 21, a method such as CMP using the insulating layers 560 as stoppers is executed. As a result of the process, the upper surface of the semiconductor layer 540 may be formed in a concave surface (dished) shape in which a portion close to the insulating layer 560 is higher than a portion away from the insulating layer 560. The upper surface of the conductive layer 570 may also be formed in a corresponding dished surface shape.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor storage device, comprising:
a substrate;
a plurality of first conductive layers and a plurality of first insulating layers alternately stacked in a first direction intersecting a surface of the substrate;
an interconnection layer including a plurality of bit lines provided between the stacked layers and the substrate and respectively extending in a second direction crossing the first direction;

a first semiconductor layer extending through the stacked layers in the first direction and electrically connected to one of the bit lines;

a second conductive layer including a second semiconductor layer, the second conductive layer extending in the second direction above the stacked layers and electrically connected to the first semiconductor layer; and a first dividing structure provided on a first side surface in the second direction of the plurality of first conductive layers, and extending in the first direction and a third direction crossing the first direction and the second direction; and a second dividing structure provided on a second side surface in the second direction of the plurality of first conductive layers, and extending in the first direction and the third direction, wherein the first dividing structure comprises:
- a third conductive layer extending in the first direction and the third direction; and
- a second insulating layer provided between the third conductive layer and an uppermost layer among the plurality of first conductive layers, the second dividing structure comprises:
- a fourth conductive layer extending in the first direction and the third direction; and
- a third insulating layer provided between the fourth conductive layer and the uppermost layer among the plurality of first conductive layers, and the third conductive layer and the fourth conductive layer are respectively electrically connected to the second conductive layer.

2. The semiconductor storage device according to claim 1, wherein a first side surface of the second semiconductor layer facing the first dividing structure in the second direction is reverse-tapered, and a second side surface of the second semiconductor layer facing the second dividing structure in the second direction is reverse-tapered.

3. The semiconductor storage device according to claim 1, wherein an upper surface of the first dividing structure is in contact with the second conductive layer, the upper surface of the first dividing structure being closer to the substrate than are the upper surface of the second semiconductor layer.

4. The semiconductor storage device according to claim 3, wherein an upper surface of the second dividing structure is in contact with the second conductive layer, the upper surface of the second dividing structure being closer to the substrate than are the upper surface of the second semiconductor layer.

5. The semiconductor storage device according to claim 1, wherein an upper surface of the second conductive layer includes a recess above the first dividing structure.

6. The semiconductor storage device according to claim 5, wherein an upper surface of the second conductive layer includes a recess above the second dividing structure.

7. The semiconductor storage device according to claim 1, wherein an upper surface of the second semiconductor layer is a concaved surface that is concaved toward the substrate.

8. The semiconductor storage device according to claim 7, wherein an upper surface of the second conductor layer is a concaved surface that is concaved toward the substrate.

* * * * *